(12) United States Patent
Sumi et al.

(10) Patent No.: US 10,427,981 B2
(45) Date of Patent: Oct. 1, 2019

(54) PIEZOELECTRIC MATERIAL, METHOD OF MANUFACTURING THE SAME, PIEZOELECTRIC ELEMENT, AND PIEZOELECTRIC ELEMENT APPLICATION DEVICE

(71) Applicant: Seiko Epson Corporation, Tokyo (JP)

(72) Inventors: Koji Sumi, Shiojiri (JP); Kazuya Kitada, Suwa (JP); Tomohiro Sakai, Matsumoto (JP); Yasuaki Hamada, Chino (JP); Tetsuya Isshiki, Shiojiri (JP); Satoshi Kimura, Fujimi (JP); Akio Ito, Matsumoto (JP); Tsuneo Handa, Shimosuwa (JP)

(73) Assignee: Seiko Epson Corporation (JP)

( * ) Notice: Subject to any disclaimer, the term of this patent is extended or adjusted under 35 U.S.C. 154(b) by 199 days.

(21) Appl. No.: 15/520,771

(22) PCT Filed: Dec. 26, 2014

(86) PCT No.: PCT/JP2014/084701
§ 371 (c)(1),
(2) Date: Apr. 20, 2017

(87) PCT Pub. No.: WO2016/103514
PCT Pub. Date: Jun. 30, 2016

(65) Prior Publication Data
US 2017/0313625 A1    Nov. 2, 2017

(51) Int. Cl.
*H01L 41/187* (2006.01)
*C04B 35/468* (2006.01)
(Continued)

(52) U.S. Cl.
CPC ............ *C04B 35/468* (2013.01); *C04B 35/00* (2013.01); *C04B 35/453* (2013.01);
(Continued)

(58) Field of Classification Search
CPC ...... C04B 35/468; C04B 35/00; C04B 35/453; C04B 35/475; C04B 2235/32;
(Continued)

(56) References Cited

U.S. PATENT DOCUMENTS 5,637,542 A   6/1997   Takenaka
6,004,474 A   12/1999  Takenaka et al.
(Continued)

FOREIGN PATENT DOCUMENTS

CN   101 291 889 A   10/2008
CN   102531578 A     7/2012
(Continued)

OTHER PUBLICATIONS

T. Karaki et al., "Lead-Free Piezoceramics with Vertical Morphotropic Phase Boundary", The 30th Conference on Applications of Ferroelectrics Program and Lecture Proceedings, May 22-25, 2013, p. 151 (25-P-20).
(Continued)

*Primary Examiner* — J. San Martin
(74) *Attorney, Agent, or Firm* — Harness, Dickey & Pierce, P.L.C.

(57) ABSTRACT

A piezoelectric material contains: a first component which is a rhombohedral crystal in a single composition, has a Curie temperature Tc1, and is a lead-free-system composite oxide having a perovskite-type structure; a second component which is a crystal other than the rhombohedral crystal in a single composition, has a Curie temperature Tc2<Tc1, and is a lead-free-system composite oxide having a perovskite-type structure; and a third component which is a crystal other than the rhombohedral crystal in a single composition similar to the second component, has a Curie temperature Tc3≥Tc1, and is a lead-free-system composite oxide that has a perovskite-type structure and is different from the second
(Continued)

X: (1−x)BaBiO$_3$−x[(K,Na)NbO$_3$+Li]

component. When a molar ratio of the third component to the sum of the second component and the third component is α and α×Tc3+(1−α)×Tc2 is Tc4, |Tc4−Tc2|≤50° C.

10 Claims, 9 Drawing Sheets

(51) Int. Cl.
    *C04B 35/00*     (2006.01)
    *H01L 41/39*     (2013.01)
    *C04B 35/453*     (2006.01)
    *C04B 35/475*     (2006.01)

(52) U.S. Cl.
    CPC .......... *C04B 35/475* (2013.01); *H01L 41/187* (2013.01); *H01L 41/1871* (2013.01); *H01L 41/1878* (2013.01); *H01L 41/39* (2013.01); *C04B 2235/32* (2013.01); *C04B 2235/3236* (2013.01)

(58) Field of Classification Search
    CPC ........... C04B 2235/3236; H01L 41/187; H01L 41/1871; H01L 41/1878
    See application file for complete search history.

(56) References Cited

U.S. PATENT DOCUMENTS

| | | | |
|---|---|---|---|
| 7,279,823 B2 | 10/2007 | Higuchi et al. | |
| 8,182,713 B2 | 5/2012 | Xiaobing et al. | |
| 8,288,020 B2 | 10/2012 | Harigai et al. | |
| 8,480,918 B2 | 7/2013 | Miura et al. | |
| 8,636,342 B2 | 1/2014 | Sakai | |
| 8,734,670 B2 | 5/2014 | Jeon et al. | |
| 8,882,246 B2 | 11/2014 | Sakai | |
| 9,190,601 B2 | 11/2015 | Sumi et al. | |
| 9,276,193 B2 | 3/2016 | Sumi et al. | |
| 9,324,933 B2 | 4/2016 | Sumi et al. | |
| 2002/0103433 A1 | 8/2002 | Muramatsu et al. | |
| 2003/0001131 A1 | 1/2003 | Takase et al. | |
| 2003/0134738 A1 | 7/2003 | Furukawa et al. | |
| 2006/0015159 A1 | 1/2006 | Flores et al. | |
| 2007/0008388 A1 | 1/2007 | Yamaguchi et al. | |
| 2007/0189761 A1 | 8/2007 | Sudol | |
| 2008/0265718 A1 | 10/2008 | Sakashita et al. | |
| 2008/0278038 A1 | 11/2008 | Kobayashi et al. | |
| 2008/0297005 A1 | 12/2008 | Sakashita et al. | |
| 2008/0302658 A1 | 12/2008 | Sasaki et al. | |
| 2009/0267016 A1 | 10/2009 | Fukuoka et al. | |
| 2009/0267998 A1 | 10/2009 | Sakashita et al. | |
| 2010/0123370 A1 | 5/2010 | Yamaguchi et al. | |
| 2011/0254899 A1 | 10/2011 | Sakai | |
| 2011/0254901 A1* | 10/2011 | Sakai .................. | B41J 2/14233 347/71 |
| 2012/0098386 A1 | 4/2012 | Kounga Njiwa et al. | |
| 2012/0182358 A1 | 7/2012 | Miyazawa et al. | |
| 2012/0187325 A1 | 7/2012 | Hoffmann et al. | |
| 2013/0038666 A1 | 2/2013 | Harigai et al. | |
| 2013/0136951 A1 | 5/2013 | Harigai et al. | |
| 2013/0153812 A1 | 6/2013 | Jeon et al. | |
| 2014/0265729 A1 | 9/2014 | Murakami et al. | |
| 2014/0339961 A1 | 11/2014 | Maejima et al. | |
| 2015/0002585 A1* | 1/2015 | Sumi ..................... | B06B 1/06 347/68 |
| 2015/0002586 A1* | 1/2015 | Sumi ..................... | B41J 2/14201 347/68 |
| 2015/0062257 A1 | 3/2015 | Masubuchi et al. | |
| 2015/0116428 A1* | 4/2015 | Hamada ............... | B41J 2/04581 347/68 |
| 2017/0309810 A1* | 10/2017 | Sumi ..................... | H01L 41/39 |

FOREIGN PATENT DOCUMENTS

| | | |
|---|---|---|
| JP | 10-324569 A | 12/1998 |
| JP | 2002-220280 A | 8/2002 |
| JP | 2003-277143 A | 10/2003 |
| JP | 2003-289161 A | 10/2003 |
| JP | 2007-084408 A | 4/2007 |
| JP | 2009-001444 A | 1/2009 |
| JP | 2009-215111 A | 9/2009 |
| JP | 2010-241615 A | 10/2010 |
| JP | 2011-181764 A | 9/2011 |
| JP | 2011-222884 A | 11/2011 |
| JP | 2012-139923 A | 7/2012 |
| JP | 2012-164968 A | 8/2012 |
| JP | 2013-545697 A | 12/2013 |
| WO | WO-2012-026107 A1 | 3/2012 |
| WO | WO-2012-044313 A1 | 4/2012 |
| WO | WO-2013-062120 A1 | 5/2013 |
| WO | WO-2014-084265 A1 | 6/2014 |

OTHER PUBLICATIONS

T. Wada et al., "NaNbO3 Ferroelectric Ceramics", Extended Abstracts of The 64th Autumn Meeting No. 1, The Japan Society of Applied Physics, Aug. 30-Sep. 2, 2003 p. 141 (31a-YE-4).

Extended European Search Report for Application No. EP 14 16 1855 dated Nov. 10, 2014 (8 pages).

M. Zou et al., "Microstructure and Electrical Properties of (1-x)[0.82Bi0.5Na0.5TiO3-0.18Bi0.5K0.5TiO3]—xBiFeO3 Lead-Free Piezoelectric Ceramics", Journal of Alloys and Compounds, Elsevier Sequoia, Lausanne, CH, vol. 495, No. 1, Apr. 9, 2010, pp. 280-283.

Extended European Search Report for Application No. EP 14 16 1858 dated Nov. 3, 2014 (10 pages).

Y. Wu et al., "Lead-Free Piezoelectric Ceramics With Composition of (0.97-x)Na1/2Bi1/2TiO3-0.03NaNbO3—xBaTiO3", Journal of Materials Science, vol. 38, No. 5, Mar. 1, 2003, pp. 987-994.

J. Li et al., "Large Electrostrictive Strain in Lead-Free Bi0.5Na0.5TiO3—BaTiO3—KNbO3 Ceramics", Applied Physics A; Materials Science & Processing, Springer, Berlin, DE, vol. 104, No. 1, Oct. 20, 2010, pp. 117-122.

H. Nagata et al., "Large Piezoelectric Constant and High Curie Temperature of Lead-Free Piezoelectric Ceramic Ternary System Based on Bismuth Sodium Titanate-Bismuth Potassium Titanate-Barium Titanate Near the Morphotropic Phase Boundary", Japanese Journal of Applied Physics, Japan Society of Applied Physics, JP, vol. 42, No. 12, Part 1, Dec. 1, 2003, pp. 7401-7403.

Partial European Search Report for Application No. EP 14 16 1857 dated Nov. 10, 2014 (8 pages).

A. Singh et al., "Structural and Electrical Properties of BKT Rich Bi0.5K0.5TiO3—K0.5Na0.5NbO3 System", AIP Advances, American Institute of Physics, 2 Huntington Quadrangle, Melville, NY 11747, vol. 3, No. 3, Mar. 15, 2013, pp. 32129-1, paragraph 1-pp. 32129-3, paragraph 2.

A. Sasaki et al., "Dielectric and Piezoelecric Properties of (Bi0.5Na0.5)TiO3—(Bi0.5K0.5)TiO3 Systems", Japanese Journal of Applied Physics, vol. 38, No. 9B, Sep. 1, 1999, pp. 5564-5567.

Y. Hiruma et al., Phase Diagrams and Electrical Properties of (Bi1/2Na1/2)TiO3-Based Solid Solutions, Journal of Applied Physics, American Institute of Physics, U.S., vol. 104, No. 12, Dec. 17, 2008, pp. 124106/1-124106/7.

J. Yi et al., "The Role of Cation Vacancies on Microstructure and Piezoelectricity of Lanthanum-Substituted (Na1/2Bi1/2)TiO3 Ceramics", Japanese Journal of Applied Physics, vol. 43, No. 9A, Sep. 1, 2004, pp. 6188-6192.

Extended European Search Report for Application No. EP 14 16 1857 dated Jul. 23, 2015 (18 pages).

Hong-Qiang Wang et al., "Phase Transition Behavior and Electrical Properties of (1-x)Bi0.5Na0.5TiO3-x(Na0.53K0.44Li0.04)(Nb0.88Sb0.08Ta0.04)O3 Lead-Free Ceramics", Journal of the European Ceramic Society, Elsevier Science Publishers, Barking, Essex, GB, vol. 32, No. 8, Jan. 10, 2012, pp. 1481-1484.

L. Ramajo et al., "Influence of MoO3 on Electrical and Microstructural Properties of (K0.44Na0.52Li0.04)(Nb0.86Ta0.10Sb0.04)O3", Appli-

(56) References Cited

OTHER PUBLICATIONS cations of Ferroelectrics Held Jointly with 2012 European Conference on the Applications of Polar Dielectrics and 2012 International Symp Piezoresponse Force Microscopy and Nanoscale Phenomena in Polar Materials (ISAF/ECAPD/PFM), 2012 Intl. Symp., Jul. 9, 2012, pp. 1-4.

B. Wang et al., "Piezoelectric and Ferroelectric Properties of (Bi1-xNa0.8K0.2Lax)0.5TiO3 Lead-Free Ceramics", Journal of Alloys and Compounds, vol. 526, Jun. 1, 2012, pp. 79-84.

V.R. Cooper et al., "La-Driven Morphotrophic Phase Boundary in the Bi(Zn1/2Ti1/2)O3—La(Zn1/2Ti1/2)O3—PbTiO3 Solid Solution", Chemistry of Materials, vol. 24, No. 22, Nov. 27, 2012, pp. 4477-4482.

C.C. Huang et al., "Phase Transitions and Dielectric Properties in Bi(Zn1/2Ti1/2)O3—ABO3 Perovskite Solid Solutions", Applications of Ferroelectrics, 2008, ISAF 2008, 17th IEEE International Symposium on The, IEEE, Piscataway, NJ, USA, Feb. 23, 2008, pp. 1-3.

B.K. Barick et al., "Phase Transition and Electrical Properties of Lanthanum-Modified Sodium Bismuth Titanate", Materials Chemistry and Physics, Elsevier SA, Switzerland, Taiwan, Republic of China, vol. 132, No. 2, Dec. 21, 2011, pp. 1007-1014.

International Search Report (in English and Japanese) and Written Opinion (in Japanese) of the International Searching Aurthority issued in PCT/JP2014/084700, dated Mar. 24, 2015, ISA/JPO.

International Search Report (in English and Japanese) and Written Opinion (in Japanese) of the International Searching Aurthority issued in PCT/JP2014/084701, dated Mar. 24, 2015, ISA/JPO.

T. Takenaka, "Current Developments and Future Prospects of Lead-free Piezoelectric Ceramics". Materials Integration, Jun. 25, 2009, vol. 22, No. 7, pp. 1-24.

R. Aoyagi et al., "$Bi_{1/2}Na_{1/2}TiO_3$—$BaTiO_3$—$BiFeO_3$-kei Hien Atsuden Ceramics no Tokusei (Properties of $Bi_{1/2}Na_{1/2}TiO_3$—$BaTiO_3$—$BiFeO_3$ Lad-Free Piezoelectric Ceramics)", Dai 70 Kai Extended Abstracts, The Japan Society of Applied Physics, No. 1, Sep. 8, 2009, p. 218 (8p-ZH-13).

T. Karaki et al., "Morphotropic Phase Boundary Slope of (K,Na,Li)NbO3—BaZrO3 Binary System Adjusted Using Third Component (Bi,Na)TiO3 Additive", Japanese Journal of Applied Physics, vol. 52, Sep. 20, 2013, pp. 09KD11-1 to 09KD11-4.

I. Fujii et al., "Effect of Sintering Condition and V-doping on the Piezoelectric Properties of $BaTiO_3$—$Bi(Mg_{1/2}Ti_{1/2})O_3$—$BiFeO_3$ Ceramics", Journal of the Ceramic Society of Japan, vol. 121, No. 8, Aug. 1, 2013. pp. 589-592.

Supplementary European Search Report for Patent Application No. EP 14909116.7, dated Sep. 27, 2018 (8 pages).

Extended European Search Report for Application No. EP 14 90 9115 dated Jun. 29, 2018 (9 pages).

Zhou C. et al, "Structure and Piezoelectric Properties of $Bi_{0.5}Na_{0.5}TiO_3$—$Bi_{0.5}K_{0.5}TiO_3$—$BiFeO_3$ Lead-Free Piezoelectric Ceramics", Materials Chemistry and Physics, Elsevier SA, Switzerland, Taiwan, Republic of China, vol. 114, No. 2-3, Apr. 15, 2009, pp. 832-836.

\* cited by examiner

X: (1−x)BaBiO$_3$−x[(K,Na)NbO$_3$+Li]

A-A'

PIEZOELECTRIC MATERIAL, METHOD OF MANUFACTURING THE SAME, PIEZOELECTRIC ELEMENT, AND PIEZOELECTRIC ELEMENT APPLICATION DEVICE

CROSS-REFERENCE TO RELATED APPLICATION

This application is a U.S. National Stage Application of International Application No. PCT/JP2014/084701, filed on Dec. 26, 2014, and published in Japanese as WO 2016/103514 A1 on Jun. 30, 2016. The entire disclosure of the above application is incorporated herein by reference.

TECHNICAL FIELD

The present invention relates to a piezoelectric material, a method of manufacturing the same, and a piezoelectric element including the piezoelectric material. In addition, the invention relates to a piezoelectric element application device on which the piezoelectric element is mounted. Examples of the piezoelectric element application device include an actuator, an ultrasonic device such as an ultrasonic oscillator, an ultrasonic sensor, an ultrasonic motor, a pressure sensor, a piezoelectric motor, a pyroelectric element such as an IR sensor, a power generation device, and the like.

BACKGROUND ART

In the related art, in the actuator, the ultrasonic device such as the ultrasonic oscillator, the ultrasonic motor, the pressure sensor, the pyroelectric element such as the IR sensor, and the like, high piezoelectric properties are demanded for a piezoelectric material that is used as a piezoelectric layer (piezoelectric ceramic) constituting a piezoelectric element or the like which is mounted on a device (piezoelectric element application device) using a piezoelectric element as a drive source. Examples of properties which are demanded for a piezoelectric substance includes various properties such as a piezoelectric constant, a dielectric constant, and Young's modulus, and the invention gives attention to a piezoelectric constant (d33). Hereinafter, the "piezoelectric properties" represent the piezoelectric constant (d33). Representative examples of the piezoelectric material having high piezoelectric properties include lead zirconate titanate (PZT).

However, there is a demand for a piezoelectric material in which an amount of lead that is contained is suppressed from the viewpoint of an environmental problem. Example of a lead-free based piezoelectric material include a piezoelectric material such as $K_xNa_{(1-x)}NbO_3$ and $(Ba, Na)TiO_3$ which contain an alkali metal, and a piezoelectric material such as $BiFeO_3$—$BaTiO_3$ that does not contain the alkali metal.

In the piezoelectric materials, there is known that when using a composition in the vicinity of a morphotropic phase boundary (MPB), large piezoelectric properties are obtained. However, with regard to a phase diagram in which the horizontal axis represents a composition, and the vertical axis represents a temperature (hereinafter, referred to as a phase diagram), in PZT, an MPB line is located to be approximately parallel to the temperature axis or approximately perpendicular to the composition axis. In contrast, in the lead-free-system piezoelectric material, generally, the MPB line is inclined with respect to the temperature axis (For example, refer to FIG. 1 and the like of Japanese Unexamined Patent Application Publication No. 2009-215111). In a case where the MPB line is inclined as described above, even when selecting a specific temperature in accordance with desired properties, for example, a composition that is located on the MPB at room temperature, there is a problem that a temperature region, in which the piezoelectric properties decrease due to a variation in the use environment temperature, heat generation during use, and the like, exists when considering that if the use environment temperature varies, the composition is distant from the MPB line.

Accordingly, there is a demand for a lead-free-system piezoelectric material in which the MPB line is parallel to the temperature axis as much as possible in the above-described phase diagram, and temperature dependence of piezoelectric properties is small. In addition, although it is needless to say that high piezoelectric properties are demanded for the piezoelectric material, a high Curie temperature (Tc) is an important condition that is demanded for the piezoelectric material from a relationship with the use environment temperature. This is because the piezoelectric material functions only at a temperature lower than the Curie temperature. A piezoelectric material in which the Curie temperature is high can be used in a relatively wide temperature range, and thus general-purpose properties are high. However, generally, the piezoelectric material in which the Curie temperature is high has a tendency in which piezoelectric properties are poor.

Here, it is considered that a plurality of piezoelectric materials having compositions different from each other are used in combination so as to obtain a piezoelectric material satisfying conditions such as making the MPB line parallel to the temperature axis as much as possible, and reduction in temperature dependence of piezoelectric properties (refer to Japanese Unexamined Patent Application Publication No. 2003-277143, Japanese Unexamined Patent Application Publication No. 2011-181764, and the like). In addition, in the following description, in a phase diagram in which the horizontal axis represents a composition and the vertical axis represents a temperature, a state in which the MPB line is nearly parallel to the temperature axis, or a state in which the MPB line is nearly perpendicular to the composition axis is expressed by "MPB line stands up".

However, there is no still finding indicating a clear index regarding to whether or not a piezoelectric material, in which the MPB line stands up and thus the temperature dependence of piezoelectric properties is less, can be obtained in what kind of combination of what kinds of components, whether or not a piezoelectric material, in which the piezoelectric properties are high, can be obtained in what kind of combination of what kinds of components, and whether or not a piezoelectric material, in which the Curie temperature is high, can be obtained in what kind of combination of what kinds of components. In addition, among a plurality of conditions such as less temperature dependence of piezoelectric properties, high piezoelectric properties, and a high Curie temperature, when only one condition is satisfied, it cannot be said that the material is a piezoelectric material with high practical utility. It is preferable that a composition simultaneously satisfies the plurality of conditions so as to obtain a piezoelectric material with high practical utility. There is no clear index, and thus it is very difficult to find a combination and a composition of components as described above. Currently, as the piezoelectric material that simultaneously satisfies the plurality of conditions as described above, substantially, only PZT can be exemplified. In addition, a lead-free-system piezoelectric material comparable to PZT is not present. Accordingly, there is a demand for the lead-free-system piezoelectric material in which the MPB line stands up, the piezoelectric properties are high in a wide operating ambient temperature, and the Curie temperature is high similar to PZT.

In consideration of the above-described situations, an object of the invention is to provide a piezoelectric material in which an environmental load is low and which is excellent in practical utility, a method of manufacturing the same, and a piezoelectric element and a piezoelectric element application device which use the piezoelectric material.

SUMMARY

To solve the problem, according to an aspect of the invention, there is provided a piezoelectric material containing: a first component which is a rhombohedral crystal in a single composition, in which a Curie temperature is Tc1, and which is composed of a lead-free-system composite oxide having a perovskite-type structure; a second component which is a crystal other than the rhombohedral crystal in a single composition, in which a Curie temperature Tc2 is lower than Tc1, and which is composed of a lead-free-system composite oxide having a perovskite-type structure; and a third component which is a crystal other than the rhombohedral crystal in a single composition similar to the second component, in which a Curie temperature Tc3 is equal to or higher than Tc1, and which is composed of a lead-free-system composite oxide that has a perovskite-type structure and is different from the second component. When a molar ratio of the third component to the sum of the second component and the third component is set as α and α×Tc3+(1−α)×Tc2 is set as Tc4, |Tc4−Tc1| is 50° C. or lower.

In this aspect, since lead is not contained, it is possible to reduce an environmental load. In addition, a piezoelectric material, in which an MPB line stands up and temperature dependence of piezoelectric properties is less, is obtained.

In the piezoelectric material, it is preferable that the piezoelectric material has a composition in the vicinity of MPB in a phase diagram in which the horizontal axis represents a molar ratio of the second component to the sum of the first component, the third component, and the second component, and the vertical axis represents a temperature. The MPB line is a boundary line that is made by crystal systems different from each other. A piezoelectric constant of the piezoelectric material varies in accordance with a composition of the material. That is, piezoelectric properties have composition dependency. In a composition (MPB composition) on the MPB line, the piezoelectric constant has a maximum value. When employing a composition in the vicinity of MPB in a piezoelectric material in which the MPB line stands up, it is possible to maintain a state, in which the piezoelectric properties are high, in a wide temperature range. In the invention, a composition region, in which the piezoelectric constant is in a range equal to or greater than 70% with respect to a piezoelectric constant of an MPB composition at room temperature (an arbitrary temperature in a range from 20° C. to 25° C.), is defined as the composition in the vicinity of MPB.

In addition, it is preferable that a Curie temperature at a composition in the vicinity of MPB is higher than 280° C. According to this, it is possible to realize a piezoelectric material which has less temperature dependence of piezoelectric properties and high piezoelectric properties, and is capable of being used in a wide temperature range.

In addition, it is preferable that the first component is any one component among components of a Ba-system including barium at an A site, a Nb-system including niobium at a B site, and a Bi-system including bismuth at the A site, and the second component is any one component, which is different from the first component, among the components of the Ba-system including barium at the A site, the Nb-system including niobium at the B site, and the Bi-system including bismuth at the A site. When components, which pertain to material systems different from each other, are combined, advantage of each material is utilized, and thus it is possible to realize a piezoelectric material that is more excellent in practical utility.

In addition, it is preferable that in a range in which the molar ratio of the second component and the third component to the sum of the first component, the second component, and the third component is 0.1 to 0.9, the Curie temperature is higher than 280° C. In a piezoelectric material in this system, even when employing any composition, the Curie temperature becomes sufficiently high, and thus it is possible to suppress a variation in a temperature dependence of piezoelectric properties tendency of the piezoelectric properties, which is caused due to an error in a composition, to a very small degree.

In addition, it is preferable that the molar ratio of the third component to the sum of the second component and the third component is 0.05 to 0.49. It is considered that the ratio of the third component is preferably not too high when considering a typical tendency in which a piezoelectric material having a high Curie temperature is poor in the piezoelectric properties. On the other hand, when the ratio of the third component is too low, Tc4 does not reach a temperature that is sufficiently high, and thus the condition in which |Tc4−Tc1| is 50° C. or lower may not be satisfied.

According to another aspect of the invention, there is provided a piezoelectric element including a piezoelectric layer formed from the piezoelectric material according to the above-described aspect, and electrodes between which the piezoelectric layer is interposed.

According to this, since the piezoelectric material does not contain lead, it is possible to reduce an environmental load. In addition, since a piezoelectric material, in which an MPB line stands up and temperature dependence of piezoelectric properties is less, is used, it is possible to realize a piezoelectric element with less temperature dependence of piezoelectric properties.

In addition, according to still another aspect of the invention, there is provided a piezoelectric element application device including the piezoelectric element of the above-described aspect. Since the piezoelectric material does not contain lead, it is possible to reduce an environmental load. In addition, since a piezoelectric material, in which an MPB line stands up and temperature dependence of piezoelectric properties is less, is used, it is possible to realize a device with less temperature dependence of piezoelectric properties. Examples of the piezoelectric element application device include the following devices.

A liquid ejecting head including a pressure generating chamber that communicates with a nozzle opening, and the above-described piezoelectric element.

A liquid ejecting device includes the liquid ejecting head in the above-described aspect.

An ultrasonic sensor includes a vibration unit that transmits displacement, which occurs during operation of the above-described piezoelectric element, to an outer side, and a matching layer that transmits a pressure wave, which occurred, to an outer side.

A piezoelectric motor includes at least a vibration body in which the above-described piezoelectric element is disposed, and a movable body that comes into contact with.

A power generation device includes an electrode that extracts a charge, which is generated by the above-described piezoelectric element, from the electrodes.

In addition, according to still another aspect of the invention, there is provided a method of manufacturing a lead-free-system piezoelectric material composed of a three-component system composite oxide. The method includes: adding a third component which is a crystal other than a rhombohedral crystal in a single composition similar to a second component, in which a Curie temperature Tc3 is equal to or higher than Tc1, and which is composed of a lead-free-system composite oxide that has a perovskite-type structure and is different from the second component, to a two-component system including a first component which is a rhombohedral crystal in a single composition, in which a Curie temperature is Tc1, and which is composed of a lead-free-system composite oxide having a perovskite-type structure, and the second component which is a crystal other than the rhombohedral crystal in a single composition, in which a Curie temperature Tc2 is lower than Tc1, and which is composed of a lead-free-system composite oxide having a perovskite-type structure in such a manner that when a molar ratio of the third component to the sum of the second component and the third component is set as $\alpha$ and $\alpha \times Tc3 + (1-\alpha) \times Tc2$ is set as Tc4, |Tc4−Tc1| is 50° C. or lower.

According to this aspect, it is possible to manufacture a piezoelectric material in which lead is not contained and thus an environmental load is low, the MPB line stands up, and temperature dependence of piezoelectric properties is less.

In addition, it is preferable that in a phase diagram in which the horizontal axis represents a molar ratio of the second component and the third component to the sum of the first component, the second component, and the third component, and the vertical axis represents a temperature, an MPB composition is specified to manufacture a lead-free-system piezoelectric material composed of the three-component system composite oxide having a composition in the vicinity of MPB.

As described above, when employing the composition in the vicinity of MPB in a piezoelectric material in which the MPB line stands up, it is possible to maintain a state in which the piezoelectric properties are high in a wide temperature range. Accordingly, it is possible to manufacture a piezoelectric material in which the piezoelectric properties are high in a wide temperature range.

DETAILED DESCRIPTION

Figure 1:
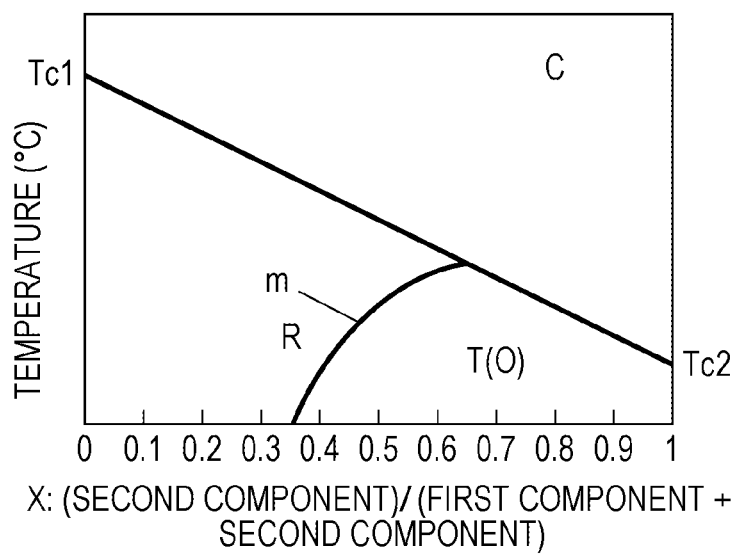
FIG. 1 is a phase diagram of a first component and a second component in a piezoelectric material of the invention.

As described above, there is no finding indicating a clear index regarding to whether or not a piezoelectric material, in which the MPB line stands up and thus the temperature dependence of piezoelectric properties is less, can be obtained in what kind of combination of what kinds of components, whether or not a piezoelectric material, in which the piezoelectric properties are high, can be obtained in what kind of combination of what kinds of components, and whether or not a piezoelectric material, in which the Curie temperature is high, can be obtained in what kind of combination of what kinds of components.

The invention provides a new method of obtaining a piezoelectric material in which the MPB line stands up as much as possible, and the temperature dependence of piezoelectric properties is less. In addition, according to the new method, it is possible to easily obtain a piezoelectric material in which the Curie temperature is high or the piezoelectric properties are high.

In addition, in the following tables, "T" represents a tetragonal crystal, "M" represents a monoclinic crystal, "R" represents a rhombohedral crystal, "O" represents an orthorhombic crystal, and "C" represents a cubic crystal.

(Piezoelectric Material)

A piezoelectric material in which the MPB line stands up as much as possible is realized by combining three components under the following conditions. Hereinafter, combination conditions will be described.

First, the three components are composed of a lead-free-system composite oxide having a perovskite-type structure. The first component is a rhombohedral composite oxide. The Curie temperature of the first component is Tc1. The second component is a composite oxide having a crystal structure other than a rhombohedral crystal. The Curie temperature of the second component is Tc2. Tc2 is lower than Tc1. The third component is a crystal other than the rhombohedral crystal similar to the second component. The third component is a composite oxide which has the same crystal structure as the second component, but is different from the second component. That is, the third component includes at least one element that is different from those constituting the second component. The Curie temperature of the third component is Tc3. Tc3 is equal to or higher than Tc1. That is, the Curie temperature Tc1 of the first component, the Curie temperature Tc2 of the second component, and the Curie temperature Tc3 of the third component satisfy a relationship of $Tc2<Tc1 \leq Tc3$.

The reason why the rhombohedral crystal is selected as the first component, and a crystal other than the rhombohedral crystal, for example, a tetragonal crystal is selected as the second component is because in the rhombohedral crystal, the number of polarization axes is the largest. The rhombohedral crystal has four polarization axes (eight polarization axes in a case of being divided into a positive direction and a negative direction), and other crystal systems, for example, a tetragonal crystal, an orthorhombic crystal, a monoclinic crystal, and a triclinic crystal have one polarization axis (bidirectional polarization axes in a case of being divided into a positive direction and a negative direction). Deformation of a piezoelectric substance is accompanied with rotation of polarization or expansion and contraction of polarization. Accordingly, it is considered that when the number of the polarization axes is large, the piezoelectric properties increase. That is, it is possible to improve the piezoelectric properties by combining the first component that is a rhombohedral crystal, and the second component and the third component which have a crystal structure other than the rhombohedral crystal.

A phase diagram of a piezoelectric material that is constituted by the first component and the second component is illustrated in FIG. 1. In FIG. 1, the vertical axis X represents a temperature (° C.). The horizontal axis represents a molar ratio of the second component to the sum of the first component and the second component ((the number of moles of the second component)/(the number of moles of the first component+the number of moles of the second component)). In FIG. 1, an MPB line m is inclined with respect to the vertical axis. The phase diagram in FIG. 1 includes a composition range (indicated by "R" in the drawing) that is constituted by a rhombohedral crystal, a tetragonal crystal (indicated by "T" in the drawing) or an orthorhombic crystal (indicated by "O" in the drawing), and a cubic crystal (indicated by "C" in the drawing). This is true of a phase diagram other than FIG. 1. The MPB line m is inclined to the right side in the drawing, that is, the MPB line m is inclined toward a side in which the ratio of the second component with low Tc is large.

Figure 2:
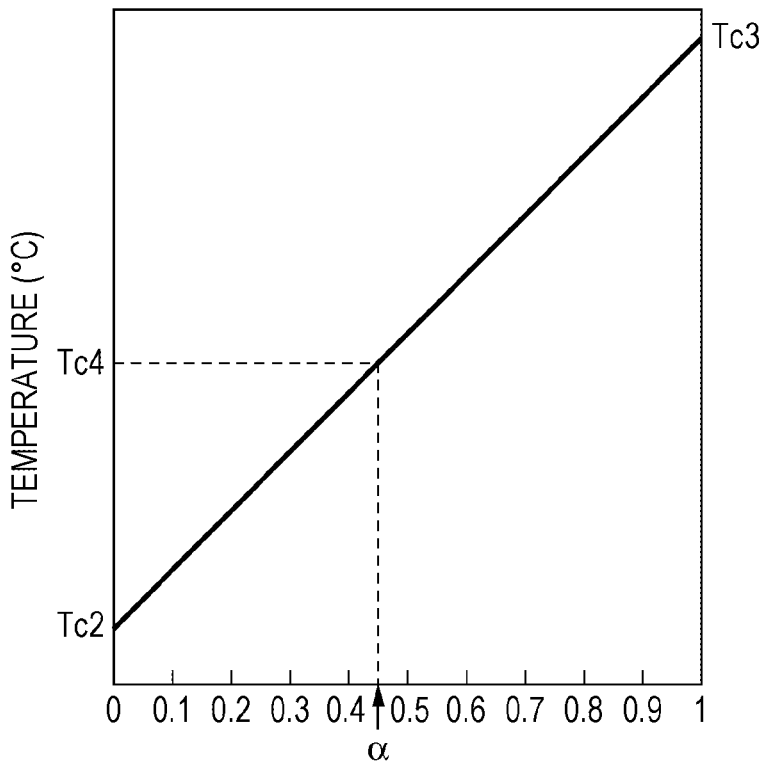
FIG. 2 is a phase diagram of the first component and a third component in the piezoelectric material of the invention.
Figure 3:
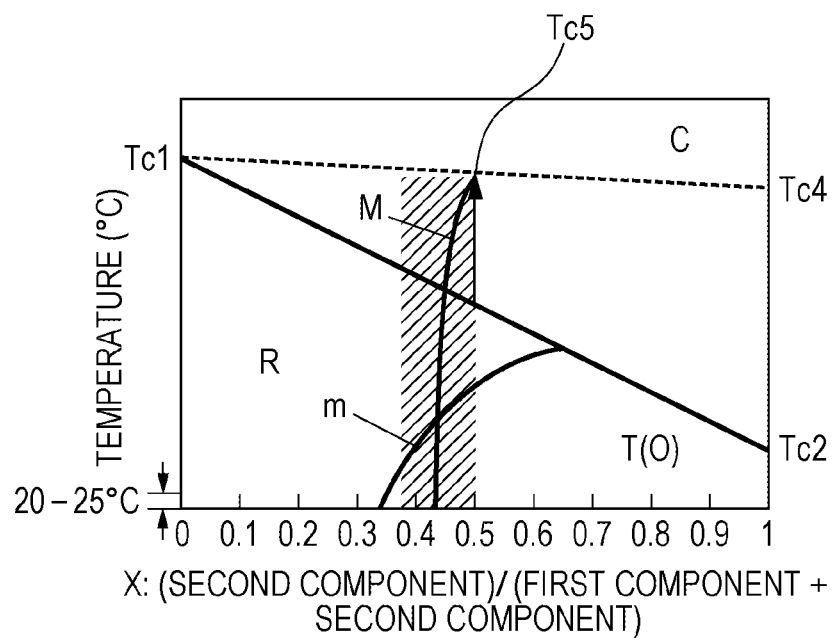
FIG. 3 is a phase diagram illustrating the piezoelectric material of the invention.
Figure 4:
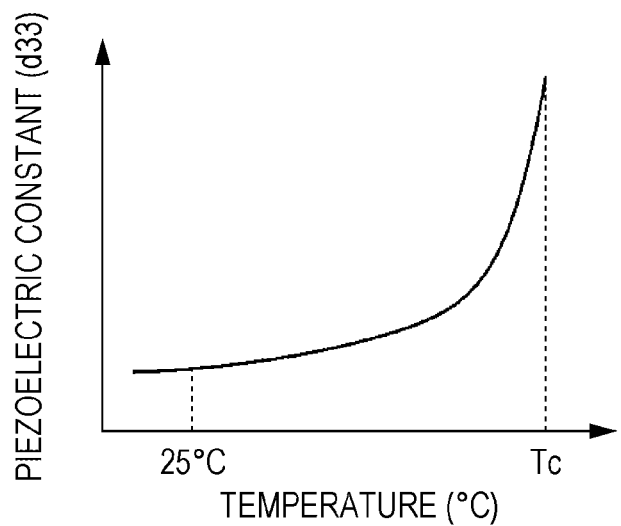
FIG. 4 is a diagram illustrating a relationship between a piezoelectric constant and a temperature.
Figure 5A:
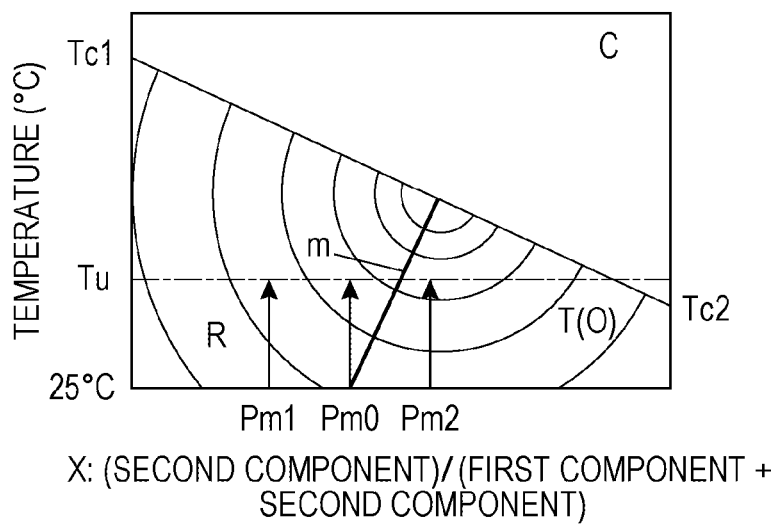
FIGS. 5a and 5b are phase diagrams illustrating a relationship between inclinations of an MPB line and a Curie temperature profile, and piezoelectric properties.
Figure 5B:
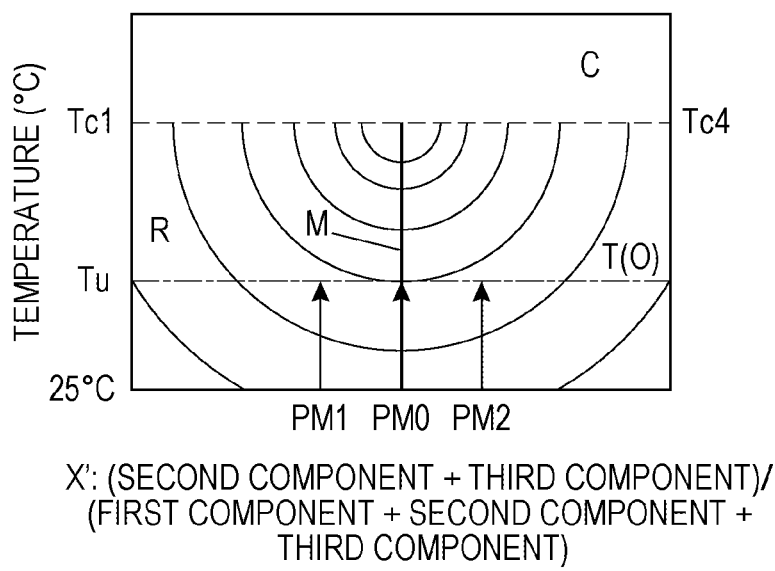

Accordingly, the third component is added to the above-described system under the following conditions. A variation due to the addition of the third component will be described with reference to FIG. 2 to FIG. 6. FIG. 2 is a phase diagram illustrating a variation in Tc due to the addition of the third component to the second component. FIG. 3 is a phase diagram illustrating a variation before and after the addition of the third component. FIG. 4 is a diagram illustrating a relationship between a piezoelectric constant (d33) and a temperature. FIGS. 5a and 5b are phase diagrams illustrating a relationship between inclinations an MPB line and a Curie temperature profile, and piezoelectric properties.

First, as described above, the third component is a crystal other than the rhombohedral crystal similar to the second component, but is a component different from the second component. In addition, the Curie temperature Tc3 of the third component is equal to or higher than Tc1. The third component is added in such a manner that a molar ratio of the third component to the sum of the second component and the third component (the number of moles of the third component/(the number of moles of the second component+the number of moles of the third component)) becomes α. In this case, as illustrated in FIG. 2, Tc on a second component side is raised from Tc2 and becomes Tc4. In FIG. 2, the vertical axis represents a temperature (° C.). The horizontal axis A represents a molar ratio of the third component to the sum of the second component and the third component ((the number of moles of the third component)/(the number of moles of the second component+the number of moles of the third component)). Tc4 is a Curie temperature of a component (referred to as a "combination component") in which the second component and the third component are combined in a molar ratio of (1−α):α, and can be obtained from a relational expression of $\alpha \times Tc3 + (1-\alpha) \times Tc2 = Tc4$.

In addition, the ratio α between a material of the first component, the second component, and the third component, and the third component is selected and determined to satisfy a condition in which |Tc4−Tc2| is 50° C. or lower. In this case, as illustrated in FIG. 3, a dotted line that connects Tc1 and Tc4 becomes approximately horizontal to the horizontal axis, and thus it enters a state in which an MPB line M further stands up in comparison to the MPB line m of a piezoelectric material to which the third component is not added. In addition, in FIG. 3, in the dotted line that connects Tc1 and Tc4, a portion except for both ends represents a Curie temperature Tc5 of a piezoelectric material (hereinafter, referred to as a "three-component system piezoelectric material") which is constituted by three components. As can be understood from a profile of the dotted line, the Curie temperature Tc5 of the three-component system piezoelectric material is raised over the entire region of the horizontal axis. In addition, for the easy understanding of comparison with FIG. 1, the horizontal axis in FIG. 3 is set as X similar to FIG. 1. However, strictly, the horizontal axis of the profile of the dotted line represents a molar ratio x' of the second component and the third component to the sum of the first component, the second component, and the third component ((the number of moles of the second component+the number of moles of the third component)/(the number of moles of the first component+the number of moles of the second component+the number of moles of the third component)).

As described above, when the three components are combined under the above-described conditions, it is possible to obtain a three-component system piezoelectric material in which the MPB line stands up as much as possible, and temperature dependence of piezoelectric properties is less. In addition, as can be seen from FIG. 3, in the three-component system piezoelectric material that is obtained by the invention, even when employing any composition, the Curie temperature Tc5 is high.

Here, the piezoelectric constant of the piezoelectric material varies in accordance with a composition of the material. That is, the piezoelectric properties have composition dependency. In a composition (MPB composition) on the MPB line, the piezoelectric constant has the maximum value. Accordingly, it is preferable to combine the three components under the above-described conditions, and to employ a composition in the vicinity of MPB so as to obtain a piezoelectric material with high properties. In the invention, a composition region, in which the piezoelectric constant is in a range equal to or greater than 70% with respect to a piezoelectric constant of the MPB composition at room temperature (an arbitrary temperature in a range from 20° C. to 25° C.), is defined as the composition in the vicinity of MPB. In FIG. 3, the composition in the vicinity of MPB is indicated by hatching.

In addition, as illustrated in FIG. 4, the piezoelectric properties is the highest at the Curie temperature regardless of a composition, and becomes lower as it is farther away from the Curie temperature toward a low temperature side. In addition, a temperature variation of the piezoelectric properties in accordance with a temperature is sharp in the vicinity of the Curie temperature, and is gentle in a region that is farther away from the Curie temperature toward a low temperature side. This aspect is illustrated in FIGS. 5a and 5b with a contour line in the phase diagrams. FIG. 5a is a phase diagram in a case where an absolute value of a difference between the Curie temperatures Tc1 and Tc2 is great, and the MPB line m is inclined. In FIG. 5a, a profile of a solid line that connects Tc1 and Tc2 corresponds to the profile of the solid line in FIG. 1 and FIG. 3. FIG. 5b is a phase diagram in a case where an absolute value of a difference between Curie temperatures Tc1 and Tc4 is small, and the MPB line M stands up. In FIG. 5b, a profile of a dotted line that connects Tc1 and Tc4 corresponds to the profile of the dotted line in FIG. 3. In the drawing, the contour line represents the height of the piezoelectric constant (d33). Although in a piezoelectric material with an actual composition, the MPB lines m and M are not straight lines, and the contour line is also not circle, in FIGS. 5a and 5b, these are illustrated in a simple manner for the easy understanding of explanation. In addition, profiles of the Curie temperature (the profile of the solid line in FIG. 5a, and the profile of the dotted line in FIG. 5b are illustrated in a more simplified state. In addition, Tu in the drawing represents the upper limit of a use temperature range of the piezoelectric material.

In FIG. 5a, an MPB composition at 25° C. is indicated by Pm0, a composition, which deviates from the MPB composition Pm0 in a direction (the left side in the drawing) in which the ratio of the second composition further decreases is indicated by Pm1, and a composition, which deviates from the MPB composition Pm0 in a direction (the right side in the drawing) in which the ratio of the second component further increases, indicated by Pm2. In FIG. 5b, the MPB composition at 25° C. is indicated by PM0, the composition, which deviates from the MPB composition PM0 in a direction in which the ratio of the second composition further decreases (the left side in the drawing) is indicated by PM1, and the composition, which deviates from the MPB composition PM0 in a direction (the right side in the drawing) in which the ratio of the second component further increases, is indicated by PM2. In the phase diagram in FIG. 5a, in a case where an environmental temperature varies, as indicated by an arrow in the drawing, Pm0, Pm1, and Pm2 are very different in a variation tendency (temperature dependence of piezoelectric properties tendency) of the piezoelectric properties. On the other hand, in the phase diagram in FIG. 5b, even though the environmental temperature varies, as illustrated by an arrow in the drawing, in PM0, PM1, and PM2, the variation tendency of the piezoelectric properties (temperature dependence of piezoelectric properties tendency) does not vary so much. That is, as illustrated in (FIG. 5b, if the MPB line stands up, and the difference in the absolute value between Tc1 and Tc4 is small, even though the composition deviates, it can be said that the variation in the temperature dependence of piezoelectric properties tendency is less likely to occur. Actually, when considering manufacturing of a piezoelectric element by using a piezoelectric material, even though the piezoelectric element is manufactured with a target for an ideal composition (for example, the MPB composition at 25° C.), deviation from the composition may finally occur in many cases. Accordingly, when using a piezoelectric material in which the MPB line stands up as much as possible, even though a compositional error occurs, the variation in the temperature dependence of piezoelectric properties tendency of the piezoelectric properties decreases, and thus it is possible to obtain a piezoelectric element in which a deviation in properties is small. In addition, the variation in the temperature dependence of piezoelectric properties tendency of the piezoelectric properties, which is described here, can be considered as one kind of "temperature dependence of piezoelectric properties".

In addition, in FIG. 5a, the contour line is illustrated in a very simplified manner, actually, even in any composition, as illustrated in FIG. 4, a variation in the piezoelectric constant (d33) is sharp in the vicinity of the Curie temperature Tc, and is gentle in a region that is farther away from the Curie temperature toward a low temperature side. Accordingly, it is preferable that the Curie temperature Tc is sufficiently higher than the upper limit Tu of the use temperature. For example, it is preferable that the Curie temperature Tc is higher than the upper limit Tu of the use temperature by 50° C. or higher, and more preferably by 100° C. or higher. In addition, it is preferable that the Curie temperature Tc is high over the entire composition range. As can be seen from FIG. 3, in the three-component system piezoelectric material that is obtained by the invention, even when employing any composition, the Curie temperature Tc5 is high. Accordingly, it can be said that a variation in the temperature dependence of piezoelectric properties tendency of the piezoelectric properties, which is caused due to an error in a composition, is small also from this viewpoint.

It is sufficient that the Curie temperature Tc5 of a piezoelectric material is higher than 280° C. when considering a typical use of the piezoelectric material. That is, when the Curie temperature Tc5 is set to a temperature higher than 280° C., it is possible to provide a piezoelectric material with very high general-purpose properties. Even when using a composition in the vicinity of MPB, the Curie temperature Tc5 may be higher than 280° C. at least in a composition in the vicinity of MPB. It is preferable that the Curie temperature Tc5 is higher than 280° C. not only in a composition in the vicinity of MPB, but also in an approximately entire composition region, for example, at a portion in which a molar ratio x of the second component to the sum of the first component, the second component, and the third component is 0.1 to 0.9. In a piezoelectric material in this system, even when employing any composition, the Curie temperature becomes sufficiently high, and thus it is possible to suppress a variation in a temperature dependence of piezoelectric properties tendency of the piezoelectric properties, which is caused due to an error in a composition, to a very small degree.

In addition, a molar ratio α of the third component to the sum of the second component and the third component is not particularly limited as long as the ratio satisfies a condition in which |Tc4-Tc2| is 50° C. or lower. However, it is preferable that the ratio of the third component is not too high when considering a typical tendency in which a piezoelectric material with a high Curie temperature is poor in piezoelectric properties. On the other hand, when the ratio of the third component is too low, there is a possibility that Tc4 may not become a sufficiently high temperature. Accordingly, it is preferable that the molar ratio α is 0.05 to 0.49, more preferably 0.10 to 0.45, and still more preferably 0.25 to 0.45.

(First Component, Second Component, and Third Component)

The first component is α rhombohedral crystal in a single composition. Examples of this perovskite-type composite oxide are illustrated in Table 1.

TABLE 1

| Compositional formula | Crystal system (Room temperature) | Curie temperature Tc (° C.) |
|---|---|---|
| Ba(Hf,Ti)O$_3$ | R | 25 |
| Ba(Sn,Ti)O$_3$ | R | 50 |
| Ba(Zr,Ti)O$_3$ | R | 70 |
| BaBiO$_3$ | R | 370 |
| (Bi,Na)TiO$_3$ + Ca(Sr) | R | 268 |
| (Bi,Na,Ba)TiO$_3$ | R | 280 |
| (Bi,Na)TiO$_3$ | R | 320 |
| (Bi,La)(Zn,Ti)O$_3$ | R | 350 |
| (Bi,Na)(Sc,Ti)O$_3$ | R | 358 |
| (Bi,Na,La)TiO$_3$ | R | 335 to 370 |
| Bi(Mg,Ti)O$_3$ | R | 395 |
| BiScO$_3$ | R | 480 |
| BiFeO$_3$ | R | 850 |
| Bi(Fe,Mn)O$_3$ | R | 850 |
| AgTaO$_3$ | R | 370 |
| SiScO$_3$ | R | 400 |

In addition, the second component and the third component are crystals other than the rhombohedral crystal in a single composition. Examples of these perovskite-type composite oxides are illustrated in Table 2.

TABLE 2

| Compositional formula | Crystal system (room temperature) | Curie temperature Tc (° C.) |
|---|---|---|
| AgNbO$_3$ | M | 67 |
| NaNbO$_3$ | T | 365 |
| KNbO$_3$ | O | 435 |
| KNbO$_3$ + Sr,Li,Sb,Ta | O | 200 to 435 |
| (K,Na)NbO$_3$ + Li | O | 270 |
| (K,Na)NbO$_3$ + Sr | O | 277 |
| (K,Na)NbO$_3$ + Sb,Ta | O | 200 to 435 |
| (K,Na)NbO$_3$ | O | 435 |
| (Bi,K)TiO$_3$ | T | 380 |
| Bi(Ni,Ti)O$_3$ | M | 67 |
| (Ba,Ca)TiO$_3$ | T | 70 |
| BaTiO$_3$ | T | 123 |
| NaTaO$_3$ | O | 480 |
| CdHfO$_3$ | O | 600 |

TABLE 2-continued

| Compositional formula | Crystal system (room temperature) | Curie temperature Tc (° C.) |
|---|---|---|
| SrZrO$_3$ | O | 700 |
| CaTiO$_3$ | O | 1260 |

Figure 6:
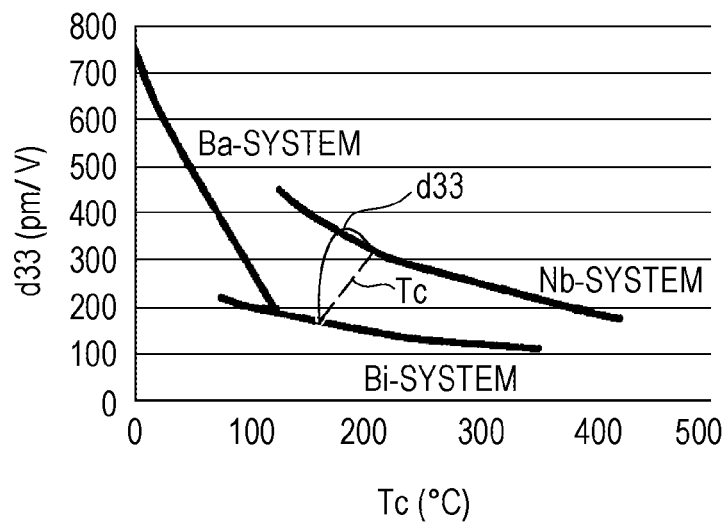
FIG. 6 is a diagram illustrating a relationship between the piezoelectric properties and the Curie temperature.

In addition, it is preferable that the first component and the second component are material systems different from each other. For example, in a case where the first component is a Bi-system component, it is preferable that the second component is a Nb-system component. In addition, for example, in a case where the first component is a Ba-system component, it is preferable that the second component is a Nb-system component. FIG. 6 is a diagram illustrating a relationship between the piezoelectric properties (d33) and the Curie temperature of the piezoelectric material. As illustrated in FIG. 6, the relationship between the piezoelectric properties (d33) and the Curie temperature of the piezoelectric material is classified into three kinds including a Ba-system including barium at an A site, a Nb-system including niobium at a B site, and a Bi-system including bismuth at the A site. In addition, when combining material systems different from each other, for example, a Bi-system component and a Nb-system component, as indicated by a dotted line in FIG. 6, the Curie temperature Tc becomes an intermediate value between the both systems, and the piezoelectric properties (d33) have a maximum value in the vicinity of the MPB line. Accordingly, as indicated by a solid line in FIG. 6, it is expected that piezoelectric properties (d33) have a value that is greater than a value on a greater side. Even when combining two kinds of the same system materials, it can be said that the same result is expected. However, a material, which pertains to a different system, may have a different advantage in many cases. Accordingly, when combining materials which pertain to systems different from each other, advantage of each material is utilized, and thus it is possible to realize a piezoelectric material that is more excellent in practical utility.

Table 3 illustrates examples of a combination of the first component, the second component, and the third component.

TABLE 3

| Specific Example 1 | | | | | | | | |
|---|---|---|---|---|---|---|---|---|
| Component | Compositional formula | Crystal system | Tc [° C.] | α | Tc4 [° C.] | \|Tc4 − Tc1\| [° C.] | Tc5 [° C.] | d33 [pm/V] |
| Second component | (K, Na)NbO$_3$ + Li | O | 270 | 0.31 to 0.49 | 321 to 351 | 19 to 49 | 346 to 360 | 150 or higher |
| Third component | (K, Na)NbO$_3$ | O | 435 | | | | | |
| First component | BaBiO$_3$ | R | 370 | — | — | | | |

| Specific Example 2 | | | | | | | | |
|---|---|---|---|---|---|---|---|---|
| Component | Compositional formula | Crystal system | Tc [° C.] | α | Tc4 [° C.] | \|Tc4 − Tc1\| [° C.] | Tc5 [° C.] | d33 [pm/V] |
| Second component | (Ba, Ca)TiO$_3$ | T | 70 | 0.48 to 0.49 | 219 to 222 | 46 to 49 | 243 to 245 | 150 or higher |
| Third component | (Bi, K)TiO$_3$ | T | 380 | | | | | |
| First component | (Bi, Na)TiO$_3$ + Sr | R | 268 | — | — | | | |

TABLE 3-continued

Specific Example 3

| Component | Compositional formula | Crystal system | Tc [° C.] | α | Tc4 [° C.] | \|Tc4 − Tc1\| [° C.] | Tc5 [° C.] | d33 [pm/V] |
|---|---|---|---|---|---|---|---|---|
| Second component | BaTiO$_3$ | T | 123 | 0.41 to 0.49 | 220 to 239 | 29 to 48 | 244 to 254 | 120 or higher |
| Third component | NaNbO$_3$ | T | 360 | | | | | |
| First component | (Bi, Na)TiO$_3$ + Sr | R | 268 | — | — | | | |

In Table 3, the ratio α of the third component that is added can be changed in a range illustrated in Table 3. In a column α, "α1 to α2" represents that the third component is added in a ratio of α1 moles to α2 moles with respect to the sum of the second component to the third component. In addition, a value of Tc4 is expressed as "Tc41 to Tc42" in a state in which a value Tc41 of Tc4 with respect to al and a value Tc42 of Tc4 with respect to α62 are made to correspond to each other. This is true of an absolute value |Tc4−Tc2| of a difference between Tc4 and Tc2. A value of Tc5 varies in accordance with a ratio of the second component, but the central value, that is, a value of the Curie temperature Tc at a molar ratio x (=0.5) of the second component to the sum of the first component, the second component, and the third component is written in correspondence with a range of α1 to α2. A value of Tc5, which is illustrated in Table 1, is not a value in the vicinity of the MPB composition. However, the absolute value of a difference between Tc4 and Tc2 is in 50° C., and it enters a state in which the MPB line stands up as much as possible, and thus the Curie temperature in the vicinity of the MPB composition may not greatly different from a value of Tc5 which is illustrated in Table 1. A value of d33 is an expected value based on FIG. 6. With regard to a value illustrated in a d33 column in Table 1, a first piezoelectric constant that is specified from material systems of the first component and the third component, and a value of Tc, and a second piezoelectric constant that is specified from a material system of the second component and a value of Tc are examined from FIG. 6, and then a value on a greater side between the first and second piezoelectric constants is illustrated in the d33 column. As described above, it is expected that the piezoelectric properties (d33) have a value that is greater than the value on a greater side between the piezoelectric constants. Accordingly, the d33 column in Table 1 is described like a value or greater (for example, "150 or higher") than a value on a greater side between the first piezoelectric constant and the second piezoelectric constant.

EXAMPLES

Hereinafter, Examples will be described. Among phase diagrams of Specific Examples to be described later, FIG. 7, FIG. 9, FIG. 10, and FIG. 11 correspond to FIG. 3. In addition, FIG. 8 corresponds to FIG. 2.

Example 1

Figure 7:
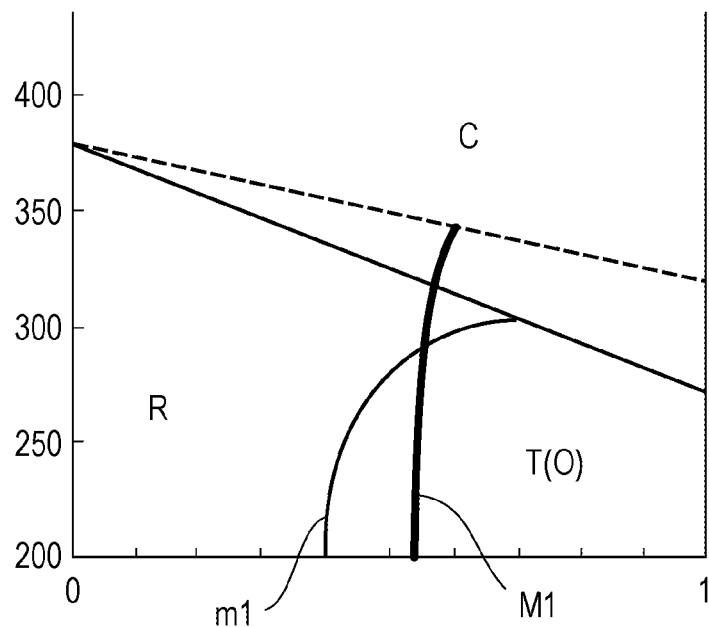
FIG. 7 is a phase diagram illustrating a piezoelectric material according to Example 1.

FIG. 7 illustrates a phase diagram in which components corresponding to Specific Example 1 in Table 3 are combined. The first component is BaBiO$_3$, and is a rhombohedral crystal in a single composition. The second component is (K, Na)NbO$_3$ in which Li is added, and is an orthorhombic crystal in a single composition. The Curie temperature Tc1 of BaBiO$_3$ that is the first component is 370° C., and the Curie temperature Tc2 of (K, Na)NbO$_3$ that is the second component is 270° C. An MPB line m1 is inclined in a range in which the molar ratio x of the second component is 0.4 to 0.7.

Figure 8:
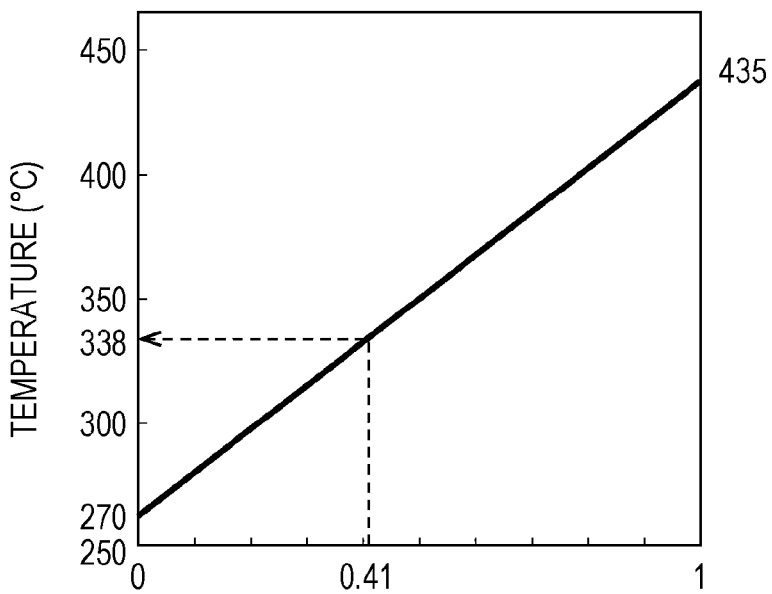
FIG. 8 is a phase diagram illustrating a second component and a third component in the piezoelectric material according to Example 1.

(K, Na)NbO$_3$ (Curie temperature Tc3 is 435° C., and is an orthorhombic crystal in a single composition), which is the third component, is mixed with the above-described system in a ratio of 0.41 to the sum of the second component and the third component. As described above, Tc4 can be obtained as a temperature corresponding to a molar ratio α in a phase diagram in which α that is a molar ratio of the third component to the sum of the second component and the third component (the number of moles of the third component/(the number of moles of the second component+the number of moles of the third component)) is represented on the horizontal axis A, and a temperature is represented on the vertical axis as illustrated in FIG. 8. Specifically, Tc4 can be expressed as α×Tc3+(1−α)×Tc2. In a case of this Example, α is 0.41, Tc2 is 270° C., and Tc3 is 435° C., and thus Tc4 becomes 338° C. Accordingly, an absolute value of a difference between Tc4 and the Curie temperature Tc1 of the first component is equal to or lower than 50° C.

As illustrated in FIG. 7, the MPB line m1 of a piezoelectric material, to which the third component is not added, is inclined with respect to the vertical axis. In contrast, an MPB line M1 of a piezoelectric material, to which the third component is added, further stands up in comparison to the MPB line m1, and only the molar ratio x' of the second component and the third component transitions in a range of 0.54 to 0.60. In addition, the Curie temperature Tc5 indicated by a dotted line is higher over the entirety of the horizontal axis.

At room temperature, the Curie temperature of the MPB composition is approximately 354° C., and the piezoelectric constant d33 is approximately 250 pC/N.

Description will be given of the following method of forming a piezoelectric material, in which BaBiO$_3$ is selected as the first component, Li-added (K$_{0.5}$, Na$_{0.5}$)NbO$_3$ is selected as the second component, and (K$_{0.5}$, Na$_{0.5}$)NbO$_3$ is selected as the third component, and which has a composition in which a molar ratio of the three components is set to 0.400:0.354:0.246, as an example of the above-described piezoelectric material. A molar ratio α of the third component to the sum of the first component and the third component is 0.41. In addition, a molar ratio x' of the second component and the third component to the sum of the first component, the second component, and the third component is 0.60.

As starting materials, barium 2-ethylhexanoate, bismuth 2-ethylhexanoate, lithium 2-ehtylhexanoate, potassium 2-ethylhexanoate, sodium 2-ehtylhexanoate, and niobium 2-ehtylhexanoate are mixed to an n-octane solution in a state in which a molar ratio of metal elements is adjusted to match a stoichiometric ratio of the above-described composition, thereby preparing a precursor solution.

The precursor solution is dropped onto a substrate. Then, the substrate is rotated at 500 rpm for 6 seconds, and then the substrate is rotated at 3000 rpm for 20 seconds, thereby forming a precursor film by suing a spin coating method. Next, the substrate is placed on a hot plate, and is dried at 180° C. for 2 minutes. Subsequently, the substrate is placed on the hot plate, and degreasing is carried out at 350° C. for 2 minutes. The processes from the application of the solution to the degreasing are repeated twice, and then baking is carried out in an oxygen atmosphere at 750° C. for 5 minutes by using an RTA apparatus. The above-described processes are repeated five times, thereby completing a piezoelectric layer.

Example 2

Figure 9:
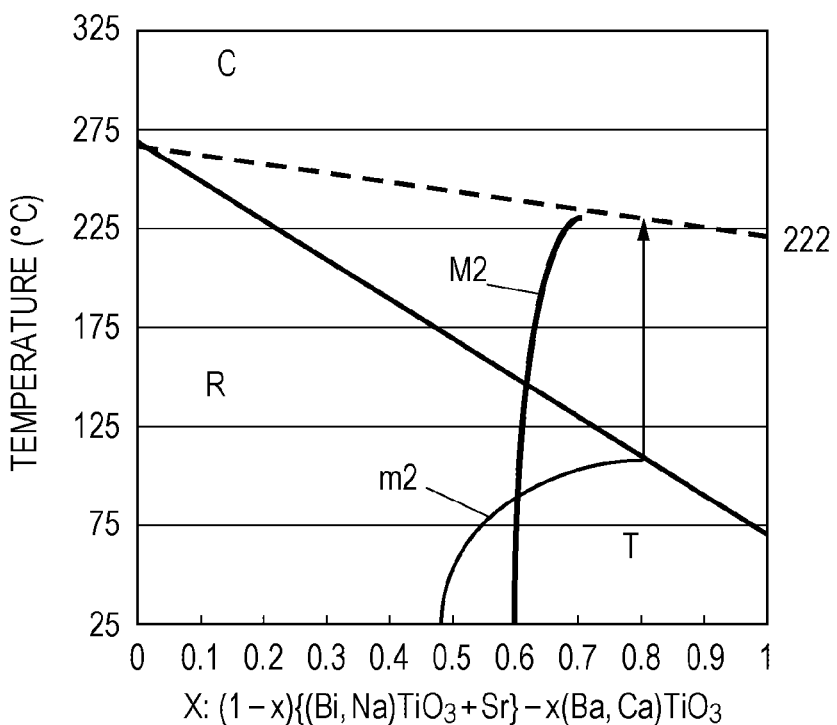
FIG. 9 is a phase diagram illustrating a piezoelectric material according to Example 2.

FIG. 9 illustrates a phase diagram in which components corresponding to Specific Example 2 in Table 3 are combined. The first component is Sr-added (Bi, Na)TiO$_3$, and is a rhombohedral crystal in a single composition. The second component is (Ba, Ca)TiO$_3$, and is a tetragonal crystal in a single composition. The Curie temperature Tc1 of Sr-added (Bi, Na)TiO$_3$, which is the first component, is 268° C., and the Curie temperature Tc2 of (Ba, Ca)TiO$_3$, which is the second component, is 70° C. An MPB line m2 is inclined in a range in which the molar ratio x of the second component is 0.47 to 0.80. When (Bi, K)TiO$_3$ (Curie temperature Tc3 is 380° C., and is a tetragonal crystal in a single composition), which is the third component, is mixed with the above-described system in a ratio of 0.49 to the sum of the second component and the third component, the Curie temperature of the composition of the second component and the third component becomes 222° C. Accordingly, the absolute value of the difference between Tc4 and the Curie temperature Tc1 of the first component is equal to or lower than 50° C. The MPB line m2 of a piezoelectric material, to which the third component is not added, is inclined with respect to the vertical axis. In contrast, the MPB line M2 of a piezoelectric material, to which the third component is added, further stands up in comparison to the MPB line m2, and only the molar ratio x of the second component transitions in a range of 0.61 to 0.70. At room temperature, the Curie temperature of the MPB composition is approximately 245° C., and the piezoelectric constant is approximately 200.

Description will be given of the following method of forming a piezoelectric layer by using a piezoelectric material, in which Sr-added (Bi$_{0.5}$, Na$_{0.5}$)TiO$_3$ is selected as the first component, (Ba$_{0.8}$, Ca$_{0.2}$)TiO$_3$ is selected as the second component, and (Bi$_{0.5}$, K$_{0.5}$)TiO$_3$ is selected as the third component, and which has a composition in which a molar ratio of the three components is set to 0.300:0.357:0.343, as an example of the above-described piezoelectric material.

As starting materials, bismuth 2-ethylhexanoate, sodium 2-ethylhexanoate, titanium 2-ethylhexanoate, barium 2-ethylhexanoate, calcium 2-ethylhexanoate, potassium 2-ethylhexanoate, and strontium 2-ethylhexanoate are mixed to an n-octane solution in a state in which a molar ratio of metal elements is adjusted to match a stoichiometric ratio of the above-described composition, thereby preparing a precursor solution.

The precursor solution is dropped onto a substrate. Then, the substrate is rotated at 500 rpm for 6 seconds, and then the substrate is rotated at 3000 rpm for 20 seconds, thereby forming a precursor film by suing a spin coating method. Next, the substrate is placed on a hot plate, and is dried at 180° C. for 2 minutes. Subsequently, the substrate is placed on the hot plate, and degreasing is carried out at 350° C. for 2 minutes. The processes from the application of the solution to the degreasing are repeated twice, and then baking is carried out in an oxygen atmosphere at 750° C. for 5 minutes by using an RTA apparatus. The above-described processes are repeated five times, thereby completing a piezoelectric layer.

Example 3

Figure 10:
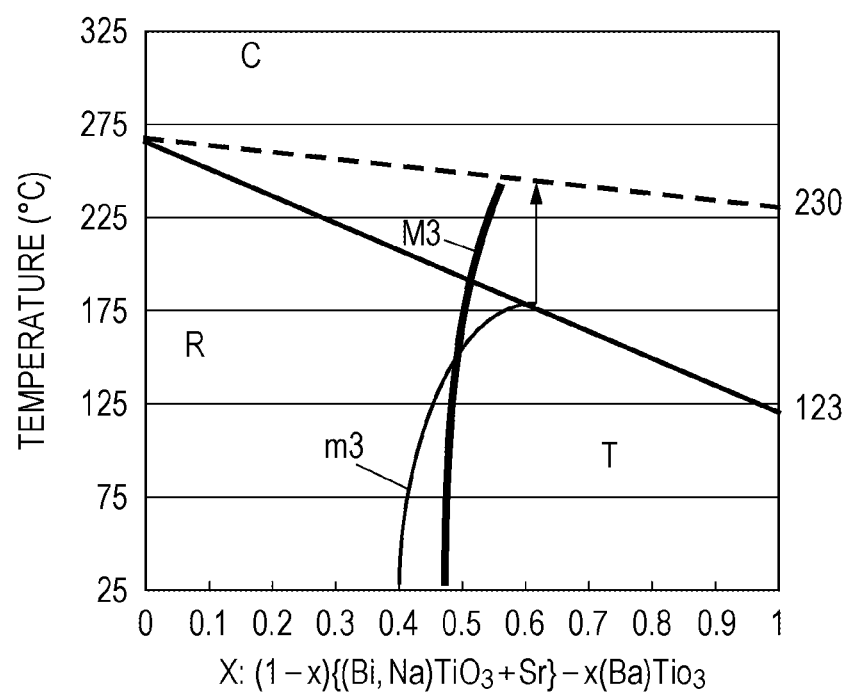
FIG. 10 is a phase diagram illustrating a piezoelectric material according to Example 3.

FIG. 10 illustrates a phase diagram in which components corresponding to Specific Example 3 in Table 3 are combined. The first component is Sr-added (Bi, Na)TiO$_3$, and is a rhombohedral crystal in a single composition. The second component is BaTiO$_3$, and is a tetragonal crystal in a single composition. In this case, the Curie temperature Tc of the Sr-added (Bi, Na)TiO$_3$, which is the first component, is 268, and the Curie temperature of BaTiO$_3$, which is the second component, is 123° C. An MPB line m3 is inclined in a range in which the molar ratio x of the second component is 0.4 to 0.6. When NaNbO$_3$ (Curie temperature Tc3 is 360° C., and is a tetragonal crystal in a single composition), which is the third component, is mixed with the above-described system in a ratio of 0.45 to the sum of the first component and the third component, the Curie temperature of the composition of the second component and the third component becomes 230° C. Accordingly, the absolute value of the difference between Tc4 and the Curie temperature Tc1 of the first component is equal to or lower than 50° C. An MPB line m3 of a piezoelectric material, to which the third component is not added, is inclined with respect to the vertical axis. In contrast, an MPB line M3 of a piezoelectric material, to which the third component is added, further stands in comparison to the MPB line m3, and only the composition ratio x of the second component varies in a range of 0.47 to 0.55. At room temperature, the Curie temperature of the MPB composition is approximately 249° C., and the piezoelectric constant is approximately 150.

As an example of the above-described piezoelectric material, a piezoelectric material, in which Sr-added (Bi$_{0.5}$, Na$_{0.5}$)TiO$_3$ is selected as the first component, BaTiO$_3$ is selected as the second component, and NaNbO$_3$ is selected as the third component, and which has a composition in which a molar ratio of the three components is set to 0.4500:0.3025:0.2475, is obtained as follows.

As starting materials, bismuth 2-ethylhexanoate, sodium 2-ethylhexanoate, titanium 2-ethylhexanoate, barium 2-ethylhexanoate, sodium 2-ethylhexanoate, niobium 2-ethylhexanoate, and strontium 2-ethylhexanoate are mixed to an n-octane solution in a state in which a molar ratio of metal elements is adjusted to match a stoichiometric ratio of the above-described composition, thereby preparing a precursor solution.

The precursor solution is dropped onto a substrate. Then, the substrate is rotated at 500 rpm for 6 seconds, and then the substrate is rotated at 3000 rpm for 20 seconds, thereby forming a precursor film by suing a spin coating method. Next, the substrate is placed on a hot plate, and is dried at 180° C. for 2 minutes. Subsequently, the substrate is placed on the hot plate, and degreasing is carried out at 350 for 2 minutes. The processes from the application of the solution to the degreasing are repeated twice, and then baking is carried out in an oxygen atmosphere at 750° C. for 5 minutes by using an RTA apparatus. The above-described processes are repeated five times, thereby completing a piezoelectric layer.

(Piezoelectric Element, Liquid Ejecting Head)

Figure 11:
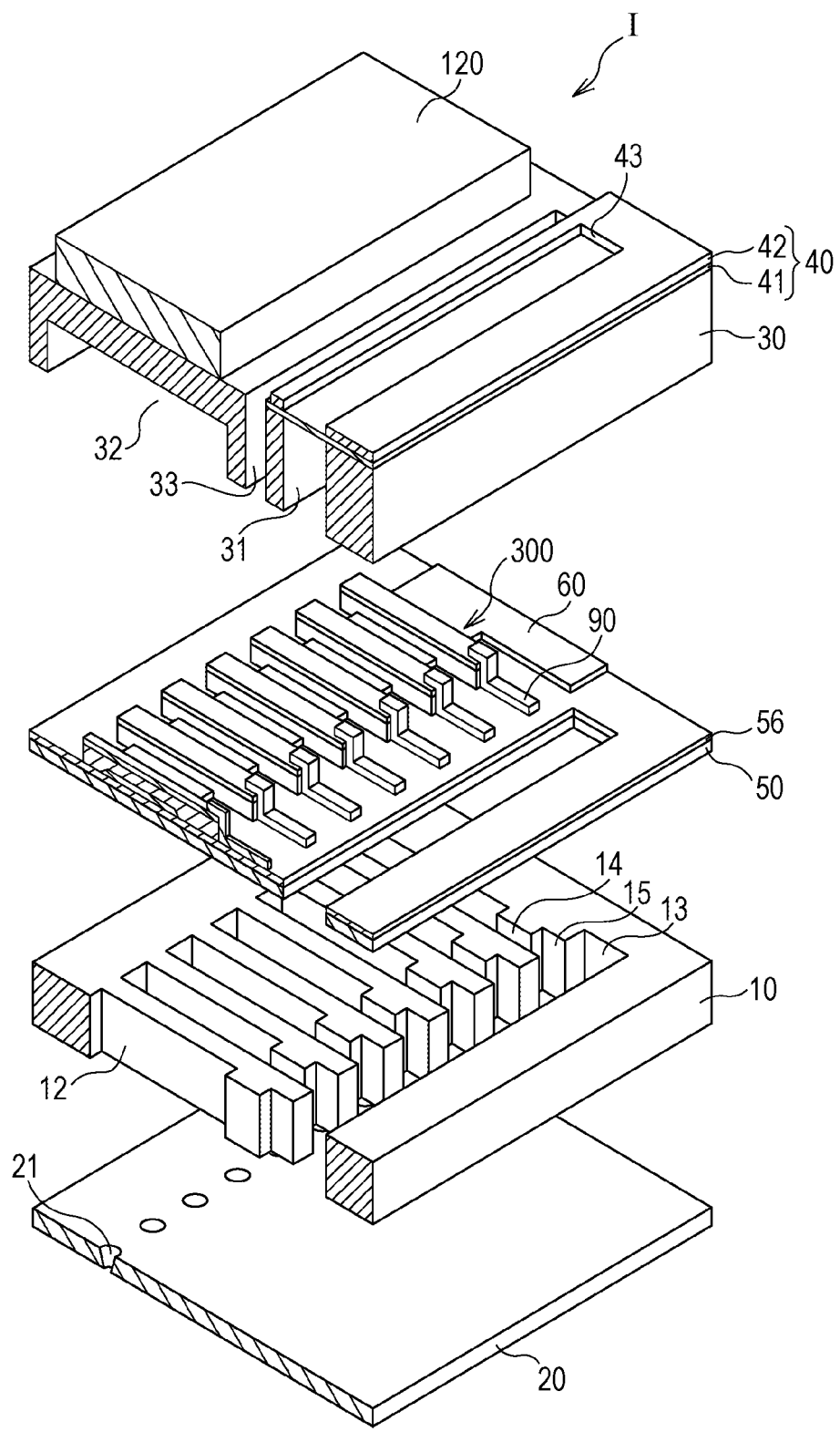
FIG. 11 is an exploded perspective view illustrating a schematic configuration of a recording head according to an embodiment of the invention.
Figure 12:
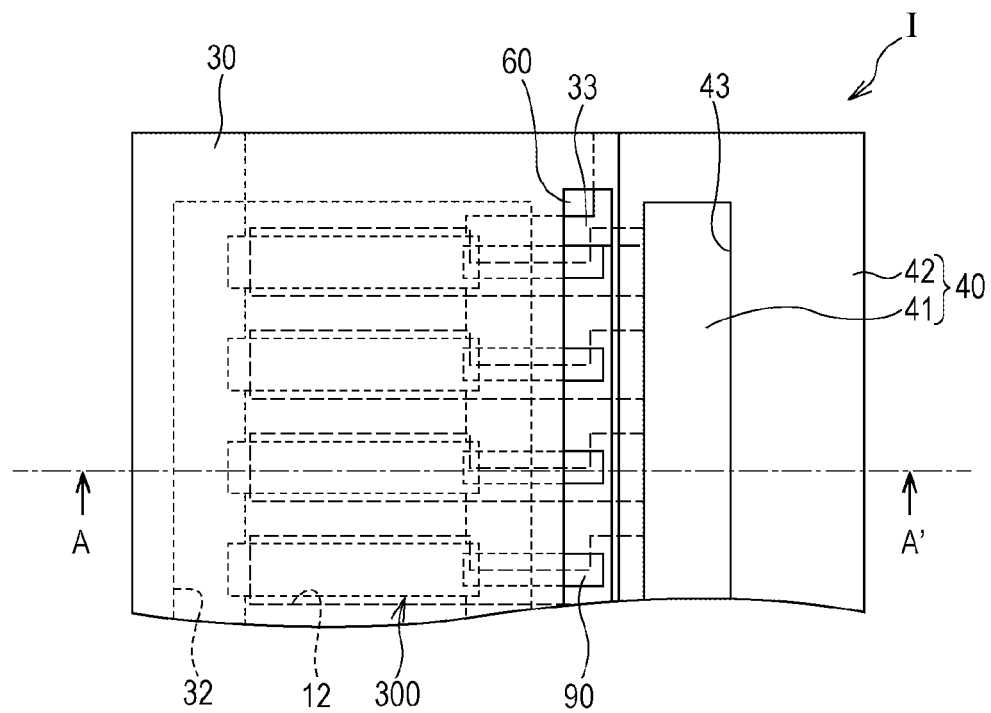
FIG. 12 is a plan view of the recording head according to the embodiment of the invention.
Figure 13:
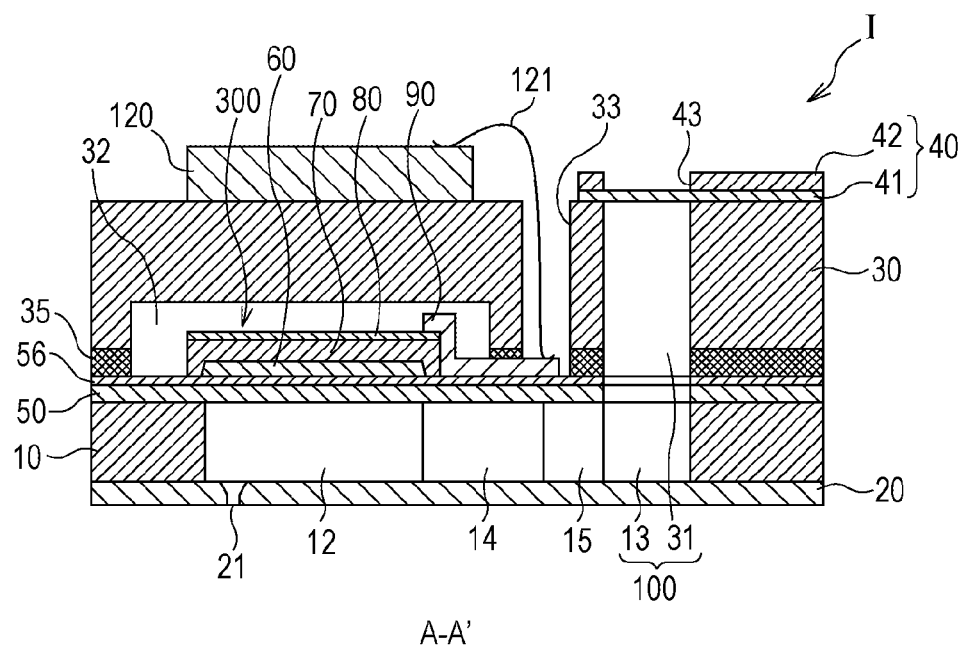
FIG. 13 is a cross-sectional view of the recording head according to the embodiment of the invention.

FIG. 11 is an exploded perspective view illustrating a schematic configuration of an ink-jet type recording head that is an example of a liquid ejecting head provided with a piezoelectric element according to an embodiment of the invention, FIG. 12 is a plan view of FIG. 11, and FIG. 13 is a cross-sectional view taken along line A-A' in FIG. 12. As illustrated in FIG. 11 to FIG. 13, a flow passage formed substrate 10 of this embodiment is constituted by a silicon single crystal substrate, and an elastic film 50 formed from silicon dioxide is formed on one surface thereof.

In the flow passage formed substrate 10, a plurality of pressure generating chambers 12 are arranged in parallel with each other in a width direction. In addition, in a region of the flow passage formed substrate 10 on an outer side of the pressure generating chambers 12 in a longitudinal direction, a communicating portion 13 is formed, and the communicating portion 13 and the respective pressure generating chambers 12 communicate with each other through an ink supply passage 14 and a communicating passage 15 which are provided for each of the pressure generating chambers 12. The communicating portion 13 communicates with a manifold portion 31 of a protective substrate to be described later, and constitutes a part of a manifold that becomes a common ink chamber of the respective pressure generating chambers 12. The ink supply passage 14 is formed in a width narrower that of each of the pressure generating chambers 12, and constantly maintains flow passage resistance of ink that is introduced from the communicating portion 13 to the pressure generating chamber 12. In addition, in this embodiment, the ink supply passage 14 is formed by narrowing the width of the flow passage on a single side, but the ink supply passage may be formed by narrowing the width of the flow passage on both sides. In addition, the ink supply passage may be formed by narrowing the flow passage in a thickness direction instead of narrowing the width of the flow passage. In this embodiment, the flow passage formed substrate 10 is provided with a liquid flow passage including the pressure generating chamber 12, the communicating portion 13, the ink supply passage 14, and the communicating passage 15.

In addition, a nozzle plate 20, through which a nozzle opening 21 communicating with the vicinity of an end of the pressure generating chamber 12 on a side opposite to the ink supply passage 14 is punched, is fixed to an opening surface side of the flow passage formed substrate 10 by an adhesive, a thermal welding film, and the like. In addition, for example, the nozzle plate 20 is formed from glass ceramic, a silicon single crystal substrate, stainless steel, and the like.

On the other hand, as described above, the elastic film is formed on a side opposite to the opening surface of the flow passage formed substrate 10, and an adhesive layer 56, which is formed from titanium oxide and the like and improves adhesiveness of the elastic film 50 and the like with the base of a first electrode 60, is formed on the elastic film 50. In addition, an insulating film formed from zirconium oxide and the like may be formed between the elastic film 50 and the adhesive layer 56 as necessary.

In addition, the first electrode 60, a piezoelectric layer 70 that is a thin film having a thickness of 2 µm or less, and preferably 0.3 µm to 1.5 µm, and a second electrode 80 are laminated on the adhesive layer 56, thereby constituting a piezoelectric element 300. Here, the piezoelectric element 300 represents a portion including the first electrode 60, the piezoelectric layer 70, and the second electrode 80. Generally, any one electrode of the piezoelectric element 300 is set as α common electrode, and the other electrode and the piezoelectric layer 70 are constituted through patterning for each of the pressure generating chambers 12. In this embodiment, the first electrode 60 is set as the common electrode of the piezoelectric element 300, and the second electrode 80 is set as an individual electrode of the piezoelectric element 300, but even when the setting is made in an inverted manner due to circumstances in a drive circuit or wiring, there is no problem. In addition, here, the piezoelectric element 300 and a vibrating plate in which displacement occurs due to operation of the piezoelectric element 300 are collectively referred to as an actuator device. In addition, in the above-described example, the elastic film 50, the adhesive layer 56, the first electrode 60, and the insulating film, which is provided as necessary, operate as the vibrating plate. However, there is no limitation thereto, and for example, the elastic film 50 or the adhesive layer 56 may not be provided. In addition, the piezoelectric element 300 may substantially serves as the vibrating plate.

In this embodiment, the piezoelectric layer 70 is formed from the above-described piezoelectric material of the invention. In the piezoelectric material, the piezoelectric properties are high and the Curie temperature is high in a wide operating ambient temperature, and thus it is possible to realize a piezoelectric element exhibiting excellent displacement characteristics at the wide use environment temperature. In addition, since the piezoelectric material does not contain lead, it is possible to reduce a load on the environment.

A lead electrode 90, which is led out from the vicinity of an end on an ink supply passage 14 side and extends onto the adhesive layer 56, and which is formed from, for example, gold (Au) and the like, is connected to the second electrode that is an individual electrode of the piezoelectric element 300.

A protective substrate 30 having a manifold portion 31, which constitutes at least a part of a manifold 100, is joined to an upper side of the flow passage formed substrate 10 on which the piezoelectric element 300 is formed, that is, an upper side of the first electrode 60, the adhesive layer 56, and the lead electrode 90 through an adhesive 35. In this embodiment, this manifold portion 31 is formed to penetrate through the protective substrate 30 in a thickness direction thereof and is formed over the width direction of the pressure generating chambers 12. As described above, the manifold portion 31 communicates with the communicating portion 13 of the flow passage formed substrate 10, and constitutes the manifold 100 that becomes the common ink chamber of the respective pressure generating chambers 12. In addition, the communicating portion 13 of the flow passage formed substrate 10 may be divided into a plurality of parts for the respective pressure generating chambers 12, and only the manifold portion 31 may be referred to as the manifold. In addition, for example, only the pressure generating chambers 12 may be provided in the flow passage formed substrate 10, and the ink supply passage 14, which communicates with the manifold 100 and the respective pressure generating chambers 12, may be provided in a member (for example, the elastic film 50, the adhesive layer 56, and the like) that is interposed between the flow passage formed substrate 10 and the protective substrate 30.

In addition, a piezoelectric element retaining portion 32, which has a space to a certain extent without blocking movement of the piezoelectric element 300, is provided in a region of the protective substrate 30 which faces the piezoelectric element 300. The piezoelectric element retaining portion 32 may have a space to a certain extent without blocking the movement of the piezoelectric element 300, and the space may be sealed or may not be sealed.

As the protective substrate 30, it is preferable to use a material having approximately the same coefficient of thermal expansion as that of the flow passage formed substrate 10, for example, glass, a ceramic material, and the like, and in this embodiment, the protective substrate is formed by using a silicon single crystal substrate that is the same material as the flow passage formed substrate 10.

In addition, a through-hole 33, which penetrates through the protective substrate 30 in a thickness direction, is provided in the protective substrate 30. In addition, the vicinity of an end of the lead electrode 90, which is led out from each piezoelectric element 300, is provided to be exposed to the inside of the through-hole 33.

In addition, a drive circuit 120, which drives the piezoelectric elements 300 which are arranged in parallel with each other, is fixed onto the protective substrate 30. As the drive circuit 120, for example, a circuit substrate, a semiconductor integrated circuit (IC), and the like can be used. In addition, the drive circuit 120 and the lead electrode 90 are electrically connected to each other through a connection wiring 121 formed from a conductive wire such as a bonding wire.

In addition, a compliance substrate 40 including a sealing film 41 and a fixing plate 42 is joined onto the protective substrate 30. Here, the sealing film 41 is formed from a flexible material with low rigidity, and a surface of the manifold portion 31 on one side is sealed with the sealing film 41. In addition, the fixing plate 42 is formed from a relatively hard material. A region of the fixing plate 42, which faces the manifold 100, is constituted by an opening 43 obtained by completely removing the fixing plate 42 in a thickness direction, and thus the surface of the manifold 100 on the one side is sealed with only the sealing film 41 having flexibility.

In the ink-jet type recording head I of this embodiment as described above, ink is introduced from an ink inlet port that is connected to an external ink supply unit (not illustrated), and the inside ranging from the manifold 100 to the nozzle opening 21 is filled with the ink. Then, a voltage is applied between the first electrode 60 and the second electrode 80, which correspond to each of the pressure generating chambers 12, in accordance with a recording signal transmitted from the drive circuit 120. According to this, the elastic film 50, the adhesive layer 56, the first electrode 60, and the piezoelectric layer 70 is subjected to bending deformation, and thus a pressure at the inside of each of the pressure generating chamber 12 increases. As a result, an ink droplet is ejected from the nozzle opening 21.

Next, description will be given of an example of a method of manufacturing the piezoelectric element of the ink-jet type recording head of this embodiment.

First, a silicon dioxide film formed from silicon dioxide ($SiO_2$), which constitutes the elastic film 50, is formed on a surface of a wafer 110 for a flow passage formed substrate which is a silicon wafer through thermal oxidation and the like. Subsequently, the adhesive layer 56 formed from titanium oxide and the like is formed on the elastic film 50 (silicon dioxide film) through a reactive sputtering method, thermal oxidation, and the like.

Next, the first electrode 60 is formed on the adhesive layer 56. Specifically, the first electrode 60, which is formed from platinum, iridium, or iridium oxide, or which has a lamination structure of these materials and the like, is formed on the adhesive layer 56. In addition, the adhesive layer 56 and the first electrode 60 can be formed, for example, by a sputtering method or a deposition method.

Subsequently, the piezoelectric layer 70 is laminated on the first electrode 60. A method of manufacturing the piezoelectric layer 70 is not particularly limited. For example, the piezoelectric layer 70 can be formed by using a chemical solution method such as a metal-organic deposition method, and a sol-gel method. In the chemical solution method, application and drying of a solution, which is obtained by dissolving and dispersing an organic metal compound in a solvent, are carried out, and then baking is carried out at a higher temperature, thereby obtaining the piezoelectric layer 70 formed from a metal oxide. In addition to these methods, the piezoelectric layer 70 can be obtained by a laser ablation method, a sputtering method, a pulse laser deposition method (PLD method), a CVD method, an aerosol deposition method, and the like.

For example, in a case of forming the piezoelectric layer 70 by a chemical application method, as starting materials, 2-ethylhexanoate, acetate, and the like, which include a desired element, are used. For example, in a case of desiring to form a piezoelectric layer formed from a perovskite type composite oxide, which includes bismuth, barium, iron, and titanium, bismuth 2-ethylhexanate, barium 2-ethylhexanoate, iron 2-ethylhexanoate, titanium 2-ethylhexanoate, and the like are used. The above-described raw material and a solvent such as an n-octane solution are mixed, and then a molar ratio of a metal element is adjusted to match a stoichiometric ratio, thereby preparing a precursor solution. Subsequently, the above-described precursor solution is dropped onto a lower electrode that is prepared in advance. Then, rotation is carried out at 500 rpm for 6 seconds, and then the substrate is rotated at 3000 rpm for 20 seconds, thereby forming a precursor film by a spin coating method. Next, the substrate is placed on a hot plate, and is dried at 180° C. for 2 minutes. Subsequently, the substrate is placed on the hot plate, and degreasing is carried out at 350° C. for 2 minutes. The processes from the application of the solution to the degreasing are repeated twice, and then baking is carried out in an oxygen atmosphere at 750 for 5 minutes by using an RTA apparatus. The above-described processes are repeated five times, thereby forming the piezoelectric layer 70.

After forming the above-described piezoelectric layer 70, the second electrode 80 formed from platinum and the like is formed on the piezoelectric layer 70 by a sputtering method and the like, and then the piezoelectric layer 70 and the second electrode 80 are simultaneously patterned in a region that faces each of the pressure generating chamber 12, thereby forming the piezoelectric element 300 including the first electrode 60, the piezoelectric layer 70, and the second electrode 80. In addition, the patterning of the piezoelectric layer 70 and the second electrode 80 can be collectively carried out by carrying out dry-etching through a resist (not illustrated) that is formed in a predetermined shape. Then, post annealing may be carried out in a temperature region of 600° C. to 800° C. as necessary. According to this, it is possible to form a satisfactory interface between the piezoelectric layer 70 and the first electrode 60 or the second electrode 80, and it is possible to improve crystallinity of the piezoelectric layer 70.

Next, the lead electrode 90, which is formed from, for example, gold (Au), and the like, is formed over the entire surface of the wafer for a flow passage formed substrate, and then patterning is carried out for each piezoelectric element 300 through a mask pattern formed from, for example, a resist, and the like.

Next, a wafer for a protective substrate, which is a silicon wafer and becomes a plurality of the protective substrates 30, is joined to a piezoelectric element 300 side of the wafer for a flow passage formed substrate through the adhesive 35, and then the wafer for a flow passage formed substrate is made thin to a predetermined thickness.

Next, a mask film is newly formed on the wafer for a flow passage formed substrate, and is patterned to a predetermined shape.

In addition, the wafer for a flow passage formed substrate is subjected to anisotropic etching (wet-etching) by using an alkali solution such as KOH through the mask film, thereby forming the pressure generating chamber 12, the communicating portion 13, the ink supply passage 14, the communicating passage 15, and the like which correspond to the piezoelectric element 300.

Then, an unnecessary portion on an outer peripheral portion side of the wafer for a flow passage formed substrate and the wafer for a protective substrate is cut and removed, for example, through dicing and the like. In addition, after removing the mask film on a surface on an opposite side, the wafer for the protective substrate of the wafer for a flow passage formed substrate is joined to the nozzle plate 20 through which the nozzle opening 21 is punched, and the compliance substrate 40 is joined to the wafer for a protective substrate. Then, the wafer for a flow passage formed substrate and the like is divided into the flow passage formed substrate 10 with a chip size, and the like, thereby obtaining the ink-jet type recording head I of this embodiment.

Hereinbefore, description has been given of an embodiment of the ink-jet type recording head and the piezoelectric element, but a configuration and a manufacturing method thereof are not limited to the above described configuration and method. For example, in the above-described embodiment, the silicon single crystal is exemplified as the substrate 10. However, there is no particular limitation thereto, and for example, a substrate such as an SOI substrate and glass may be used.

In addition, in the above-described embodiment, the piezoelectric element 300 in which the first electrode 60, the piezoelectric layer 70, and the second electrode 80 are sequentially laminated on the substrate 10 is exemplified. However, there is no particular limitation thereto, and for example, the invention is applicable to a vertical vibration type piezoelectric element in which α piezoelectric material and an electrode forming material are alternately laminated, and which is allowed to be stretched and contracted in an axial direction.

The piezoelectric layer may be formed in a bulky shape instead of the thin film as described above. In a case of being formed in a bulky shape, a carbonate or an oxide is used as starting materials. Examples of the starting materials include $K_2CO_3$, $Na_2CO_3$, $Nb_2O_5$, and the like. These starting materials are weighed to match a stoichiometric ratio, and are wet-mixed in ethanol by using a ball mill. The resultant mixture that is obtained is dried, and then is calcined at 700° C. for 3 hours. As a binder, an appropriate amount of PVA is added to the resultant calcined powder, and then pulverization and mixing are carried out by using a mortar, and particle size adjustment is carried out with a 150-mesh sieve. Then, the resultant powder that is obtained is molded into a disk-shaped pallet by using a uni-axial pressing apparatus. Next, the molded pallet and the remaining calcined powder are put into a pot, and are baked at 1100° C. for 3 hours, thereby obtaining a disk-shaped oxide. Subsequently, both surfaces of the disk-shaped oxide that is obtained are polished to smooth the surfaces. Then, silver paste is applied to the surfaces and the silver paste is baked, thereby obtaining a piezoelectric substrate including a silver electrode. In addition, with regard to the manufacturing of the above-described bulky piezoelectric layer, examples of the starting materials include barium carbonate, titanium oxide, bismuth oxide, tin oxide, iron oxide, zirconium oxide, lanthanum oxide, lithium carbonate, and the like.

Figure 14:
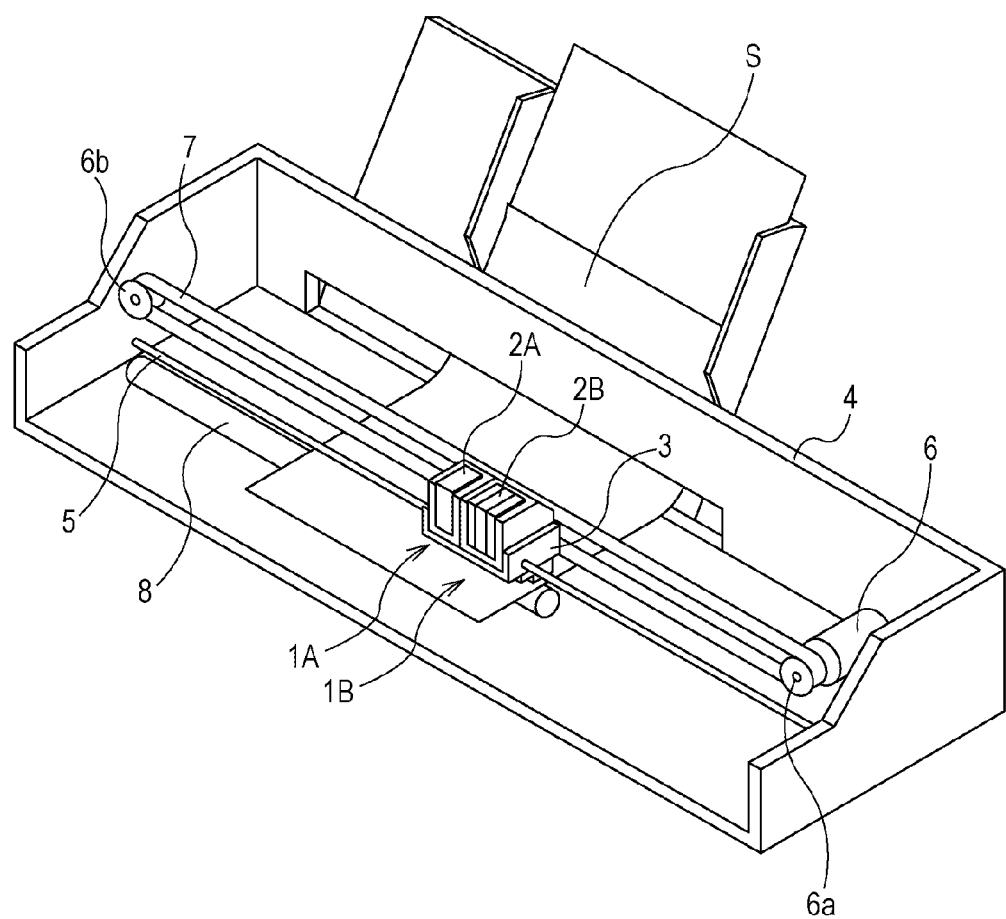
FIG. 14 is a diagram illustrating a schematic configuration of a recording apparatus according to the embodiment of the invention.

In addition, the ink-jet type recording head of this embodiment constitutes a part of a recording head unit including an ink flow passage that communicates with an ink cartridge and the like, and is mounted on the ink-jet type recording apparatus. FIG. 14 is a schematic diagram illustrating an example of the ink-jet type recording apparatus.

As illustrated in FIG. 14, cartridges 2A and 2B, which constitute an ink supply unit, are detachably provided to recording head units 1A and 1B which include the ink-jet type recording head I, and a carriage 3 on which the recording head units 1A and 1B are mounted is provided to a carriage shaft 5, which is attached to an apparatus main body 4, in a movable manner in an axial direction. For example, the recording head units 1A and 1B are configured to eject a black ink composition and a color ink composition, respectively.

In addition, a driving force of a drive motor 6 is transmitted to the carriage 3 through a plurality of gears and a timing belt 7 (not illustrated), and thus the carriage 3 on which the recording head units 1A and 1B are mounted moves along the carriage shaft 5. On the other hand, a platen 8 is provided to the apparatus main body 4 along the carriage shaft 5, and a recording sheet S, which is a recording medium such as paper that is fed by a paper feeding roller and the like (not illustrated), is transported in a state of being wound around the platen 8.

In an example illustrated in FIG. 12, the ink-jet type recording head units 1A and 1B include one ink-jet type recording head I, respectively. However, there is no particular limitation thereto, and for example, each of the ink-jet type recording head units 1A and 1B may include two or more ink-jet type recording heads.

In addition, in the above-described embodiment, description has been given of the ink-jet type recording head that is used in the ink-jet type recording apparatus as an example of the liquid ejecting head. However, the piezoelectric material of the invention is also applicable to a liquid ejecting head that ejects a liquid other than ink. Examples of this liquid ejecting head include various kinds of recording heads which are used in an image recording apparatus such as a printer, a color material ejecting head that is used to manufacture a color filter of a liquid crystal display and the like, an electrode material ejecting head that is used to form an electrode of an organic EL display, a field emission display (FED), and the like, a biogenic organic matter ejecting head that is used to manufacture a bio-chip, and the like.

As described above, the piezoelectric element of the invention is applicable to a piezoelectric element of a liquid ejecting head that is represented by an ink-jet type recording head, but there is no limitation thereto. A piezoelectric material of the invention is also applicable to a piezoelectric element that is used a piezoelectric element application device other than the liquid ejecting head. Examples of the piezoelectric element application device include an ultrasonic sensor, a piezoelectric motor, an ultrasonic motor, a piezoelectric transformer, a vibration type dust removing device, a pressure-electricity converter, an ultrasonic transmitter, a pressure sensor, an acceleration sensor, and the like.

In addition, a power generation device can also be exemplified. Examples of the power generation device include a power generation device using a pressure-electricity converting effect, a power generation device using electronic excitation (photo-electromotive force) due to light, a power generation device using electronic excitation (thermo-electromotive force) due to heat, a power generation device using vibration, and the like.

In addition, the piezoelectric material of the invention can be appropriately used in a ferroelectric element such as a ferroelectric memory.

The invention claimed is:

1. A piezoelectric material, containing:
a first component which is a rhombohedral crystal in a single composition, in which a Curie temperature is Tc1, and which is composed of a lead-free-system composite oxide having a perovskite-type structure;
a second component which is a crystal other than the rhombohedral crystal in a single composition, in which a Curie temperature Tc2 is lower than Tc1, and which is composed of Li, K, Na, and Nb; and
a third component which is a crystal other than the rhombohedral crystal in a single composition similar to the second component, in which a Curie temperature Tc3 is equal to or higher than Tc1, and which is composed of K, Na, and Nb,
wherein when a molar ratio of the third component to the sum of the second component and the third component is set as α and α×Tc3+(1−α)×Tc2 is set as Tc4, |Tc4−Tc1| is 50° C. or lower.

2. The piezoelectric material according to claim 1,
wherein the piezoelectric material has a composition in the vicinity of a morphotropic phase boundary (MPB) in a phase diagram in which the horizontal axis represents a molar ratio of the second component and the third component to the sum of the first component, the second component, and the third component, and the vertical axis represents a temperature.

3. The piezoelectric material according to claim 1,
wherein a Curie temperature at a composition in the vicinity of MPB is higher than 280° C.

4. The piezoelectric material according to claim 1,
wherein the first component is any one component among components of a Ba-system including barium at an A site, a Nb-system including niobium at a B site, and a Bi-system including bismuth at the A site.

5. The piezoelectric material according to claim 1,
wherein in a range in which the molar ratio of the second component and the third component to the sum of the first component, the second component, and the third component is 0.1 to 0.9, the Curie temperature is higher than 280° C.

6. The piezoelectric material according to claim 1,
wherein the molar ratio of the third component to the sum of the second component and the third component is 0.05 to 0.49.

7. A piezoelectric element, comprising:
a piezoelectric layer formed from the piezoelectric material according to claim 1, and
electrodes between which the piezoelectric layer is interposed.

8. A piezoelectric element application device, comprising:
the piezoelectric element according to claim 7.

9. A method of manufacturing a lead-free-system piezoelectric material composed of a three-component system composite oxide, the method comprising:
adding a third component which is a crystal other than a rhombohedral crystal in a single composition similar to a second component, in which a Curie temperature Tc3 is equal to or higher than Tc1, and which is composed of K, Na, and Nb, to a two-component system including a first component which is a rhombohedral crystal in a single composition, in which a Curie temperature is Tc1, and which is composed of, and the second component which is a crystal other than the rhombohedral crystal in a single composition, in which a Curie temperature Tc2 is lower than Tc1, and which is composed of Li, K, Na, and Nb in such a manner that when a molar ratio of the third component to the sum of the second component and the third component is set as α and α×Tc3+(1−α)×Tc2 is set as Tc4, |Tc4−Tc1| is 50° C. or lower.

10. The method of manufacturing a piezoelectric material according to claim 9,
wherein in a phase diagram in which the horizontal axis represents a molar ratio of the second component and the third component to the sum of the first component, the second component, and the third component, and the vertical axis represents a temperature, a composition in the vicinity of MPB is specified to manufacture a lead-free-system piezoelectric material composed of the three-component system composite oxide having a composition in the vicinity of MPB.

* * * * *